United States Patent
Ohata et al.

(10) Patent No.: US 12,171,059 B2
(45) Date of Patent: Dec. 17, 2024

(54) HIGH-FREQUENCY CIRCUIT AND COMMUNICATION MODULE

(71) Applicant: Mitsubishi Electric Corporation, Tokyo (JP)

(72) Inventors: Nobuo Ohata, Tokyo (JP); Keita Mochizuki, Tokyo (JP); Mizuki Shirao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 532 days.

(21) Appl. No.: 17/470,432

(22) Filed: Sep. 9, 2021

(65) Prior Publication Data

US 2021/0410269 A1    Dec. 30, 2021

Related U.S. Application Data

(63) Continuation of application No. PCT/JP2020/009547, filed on Mar. 6, 2020.

(30) Foreign Application Priority Data

Apr. 8, 2019    (WO) .................. PCT/JP2019/015324

(51) Int. Cl.
*H05K 1/02* (2006.01)
*H01P 5/08* (2006.01)
(Continued)

(52) U.S. Cl.
CPC ............... *H05K 1/025* (2013.01); *H01P 5/08* (2013.01); *H05K 1/118* (2013.01); *H05K 1/147* (2013.01);
(Continued)

(58) Field of Classification Search
CPC ........ H05K 1/025; H05K 1/118; H05K 1/147; H01P 5/08
See application file for complete search history.

(56) References Cited

U.S. PATENT DOCUMENTS 6,930,240 B1 * 8/2005 Giboney .............. H01R 12/594
439/497
2016/0064793 A1    3/2016 Yosui
(Continued)

FOREIGN PATENT DOCUMENTS

| JP | 2006-24618 A | 1/2006 |
|---|---|---|
| JP | 2016-184091 A | 10/2016 |
| WO | WO 2015/087893 A1 | 6/2015 |

OTHER PUBLICATIONS

International Search Report (PCT/ISA/210) issued in PCT/JP2019/015324 (Priority Application), mailed on Jun. 25, 2019.

*Primary Examiner* — Samuel S Outten
(74) *Attorney, Agent, or Firm* — Birch, Stewart, Kolasch & Birch, LLP

(57) ABSTRACT

A high-frequency circuit is configured so as to include a printed circuit board and a flexible circuit board connected to the printed circuit board, wherein the printed circuit board includes: a first dielectric layer having a first surface and a second surface, a first ground conductor being formed on the first surface; a second dielectric layer having a third surface and a fourth surface, a second ground conductor being formed on the fourth surface; and first signal lines wired between the second surface and the third surface, the flexible circuit board includes: a third dielectric layer having a fifth surface and a sixth surface, a third ground conductor being formed on the fifth surface; a fourth dielectric layer having a seventh surface and an eighth surface, a fourth ground conductor being formed on the eighth surface; and second signal lines wired between the sixth surface and the seventh surface.

16 Claims, 14 Drawing Sheets

(51) Int. Cl.
*H05K 1/11* (2006.01)
*H05K 1/14* (2006.01)

(52) U.S. Cl.
CPC ............... *H05K 2201/0191* (2013.01); *H05K 2201/058* (2013.01)

(56) References Cited

U.S. PATENT DOCUMENTS

2018/0123206 A1 5/2018 Yosui
2019/0269007 A1* 8/2019 Sikina .................... H01P 3/085
2020/0396826 A1* 12/2020 Yosui ........................ H01P 3/08

* cited by examiner

FIG. 8

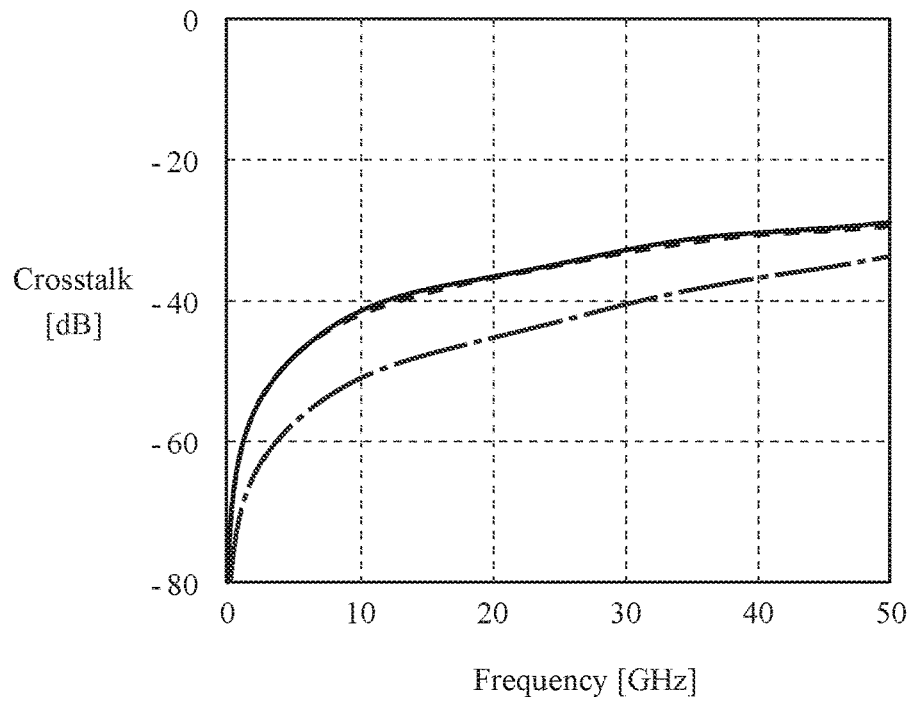

─ ·· ─ High-Frequency Circuit Illustrated in Fig. 2

───── High-Frequency Circuit When Printed Circuit Board Does Not Include First or Second Ground Conductor and Flexible Circuit Board Does Not Include Third or Fourth Ground Conductor ─ ─ ─ ─ High-Frequency Circuit When Flexible Circuit Board Includes Third and Fourth Ground Conductors but Printed Circuit Board Does Not Include First or Second Ground Conductor

FIG. 9

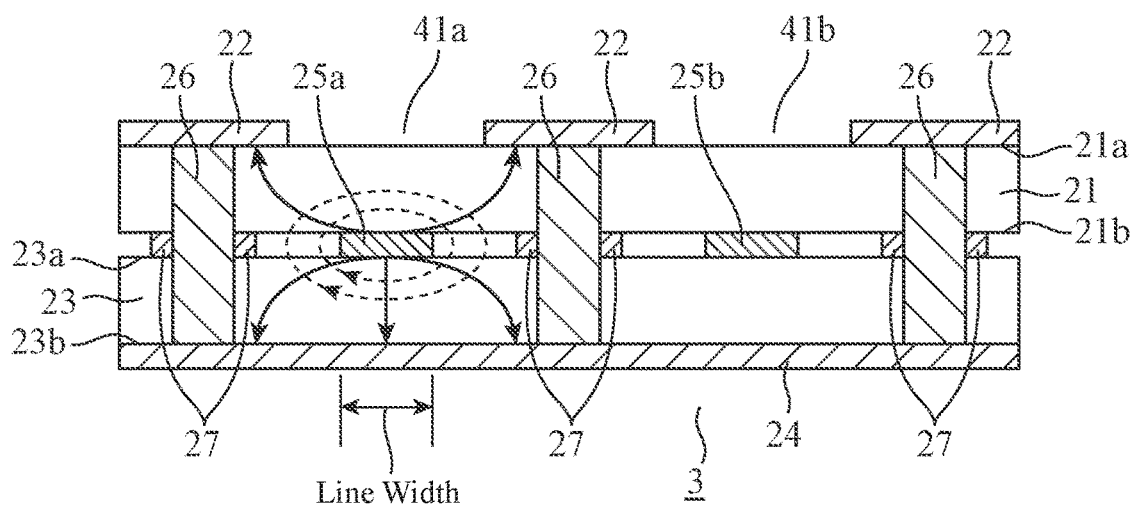

HIGH-FREQUENCY CIRCUIT AND COMMUNICATION MODULE

CROSS REFERENCE TO RELATED APPLICATIONS

This application is a Continuation of PCT International Application No. PCT/JP2020/009547 filed on 6 Mar. 2020, which claims priority under 35 U.S.C. § 119(a) to PCT International Application No. PCT/JP2019/015324 filed in Japan on 8 Apr. 2019. The above application is hereby expressly incorporated by reference, in its entirety, into the present application.

TECHNICAL FIELD

The present disclosure relates to a high-frequency circuit including a printed circuit board and a flexible circuit board, and a communication module including the high-frequency circuit.

BACKGROUND ART

Patent Literature 1 below discloses an optical module in which a printed circuit board and a flexible wiring board are connected to each other via a plurality of pads.

A flexible wiring board disclosed in Patent Literature 1 below includes a radio wave absorbing layer that absorbs radio waves in order to reduce crosstalk between two transmission lines.

CITATION LIST

Patent Literatures

Patent Literature 1: JP 2016-184091 A

SUMMARY OF INVENTION

Technical Problem

The flexible wiring board disclosed in Patent Literature 1 includes a radio wave absorbing layer. However, since the plurality of pads is arranged in a connecting portion between the printed circuit board and the flexible wiring board, it is difficult for the connecting portion to include a radio wave absorbing layer capable of sufficiently absorbing radio waves. Therefore, radio waves may leak to the outside from the connecting portion between the printed circuit board and the flexible wiring board, and crosstalk may occur disadvantageously.

The present disclosure has been achieved in order to solve the above problem, and an object of the present disclosure is to obtain a high-frequency circuit and a communication module capable of suppressing leakage of an electric field from a connecting portion between a printed circuit board and a flexible circuit board.

Solution to Problem

A high-frequency circuit according to the present disclosure includes a printed circuit board and a flexible circuit board being connected to the printed circuit board, the printed circuit board includes: a first dielectric layer having a first surface and a second surface, on the first surface a first ground conductor being formed; a second dielectric layer having a third surface and a fourth surface, on the fourth surface a second ground conductor being formed; and a plurality of first signal lines wired between the second surface and the third surface, the flexible circuit board includes: a third dielectric layer having a fifth surface and a sixth surface, on the fifth surface a third ground conductor being formed; a fourth dielectric layer having a seventh surface and an eighth surface, on the eighth surface a fourth ground conductor being formed; and a plurality of second signal lines wired between the sixth surface and the seventh surface, wherein a connecting portion, a portion between the printed circuit board and the flexible circuit board, includes: a plurality of first connecting conductors each having a first end and a second end, each of the first ends being connected to the corresponding first signal line, each of the second ends being exposed from the fourth surface without conducting the second ground conductor; and a plurality of second connecting conductors each having a first end and a second end, each of the first ends being exposed from the fifth surface without conducting the third ground conductor and being connected to the second end of the corresponding first connecting conductor, each of the second ends being connected to the corresponding second signal line.

Advantageous Effects of Invention

The present disclosure can suppress leakage of an electric field from a connecting portion between a printed circuit board and a flexible circuit board.

BRIEF DESCRIPTION OF DRAWINGS

FIG. 8 is an explanatory diagram illustrating a simulation result of crosstalk caused by leakage of an electric field from the connecting portion 4.

FIG. 9 is a cross-sectional view illustrating a cross section taken along line $B_1$-$B_2$ of a flexible circuit board 3 included in a high-frequency circuit 1 according to a second embodiment.

DESCRIPTION OF EMBODIMENTS

Hereinafter, in order to describe the present disclosure in more detail, embodiments for carrying out the present disclosure will be described with reference to the attached drawings.

First Embodiment

Figure 1:
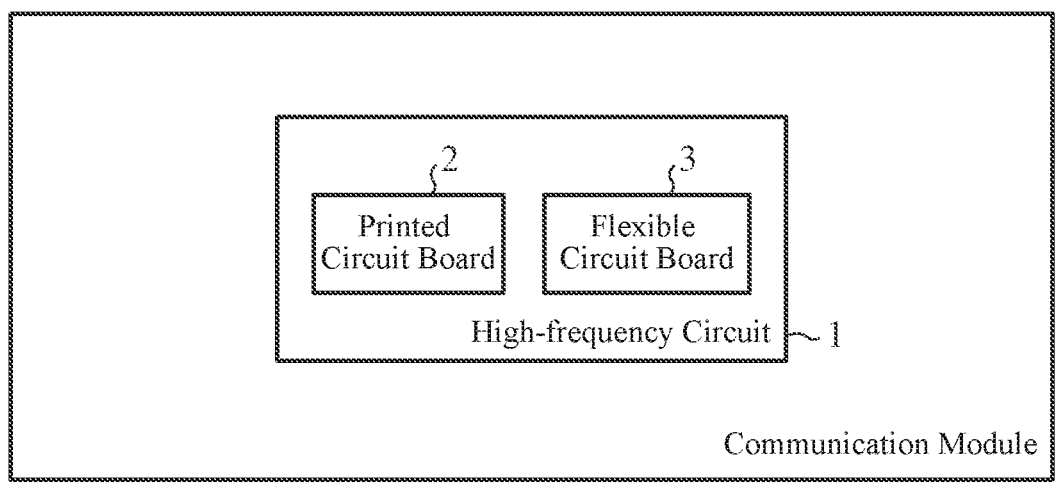
FIG. 1 is a configuration diagram illustrating a communication module including a high-frequency circuit 1 according to a first embodiment.

FIG. 1 is a configuration diagram illustrating a communication module including a high-frequency circuit 1 according to a first embodiment.

Figure 2:
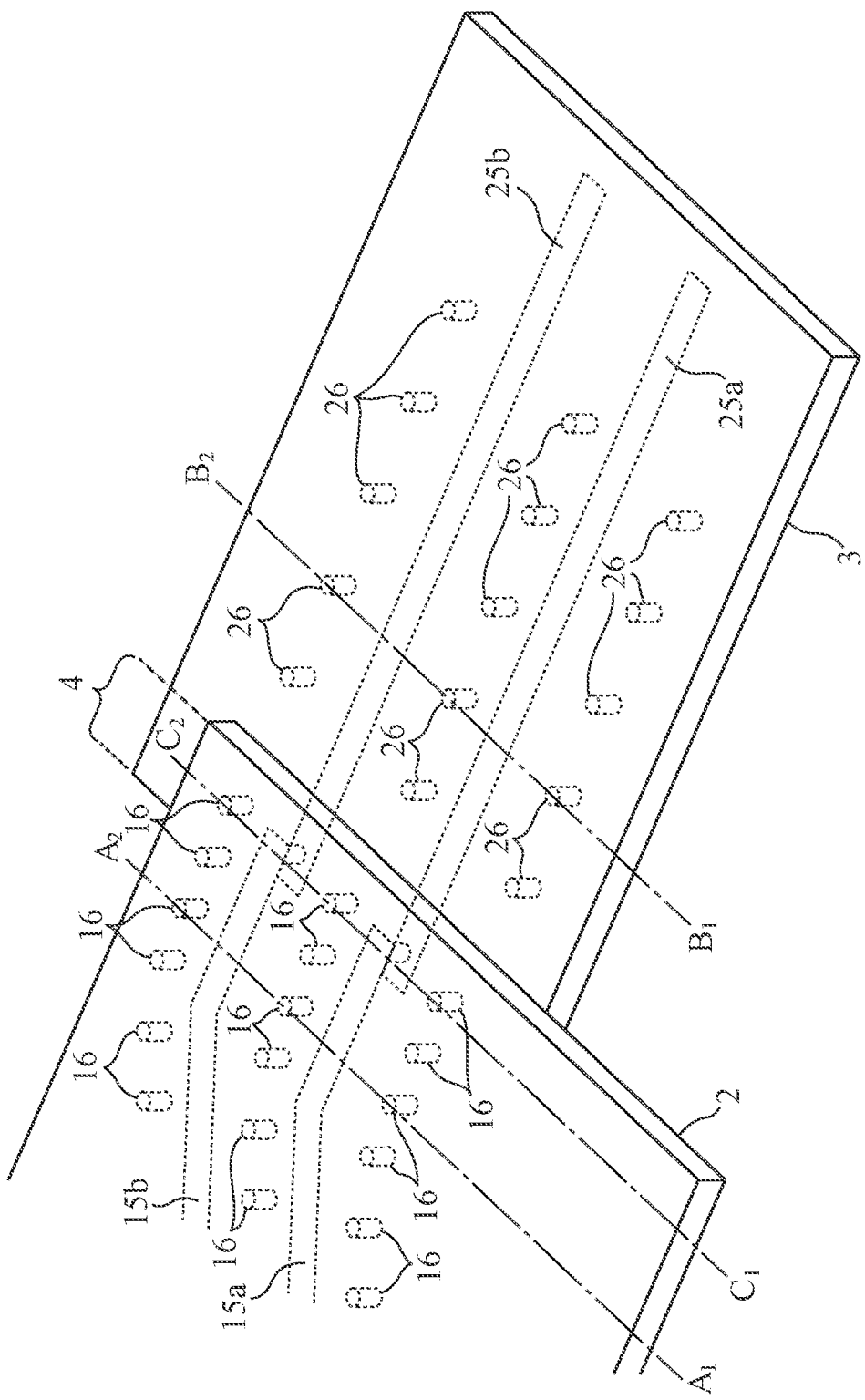
FIG. 2 is a perspective view illustrating the high-frequency circuit 1 according to the first embodiment.

FIG. 2 is a perspective view illustrating the high-frequency circuit 1 according to the first embodiment.

Figure 3:
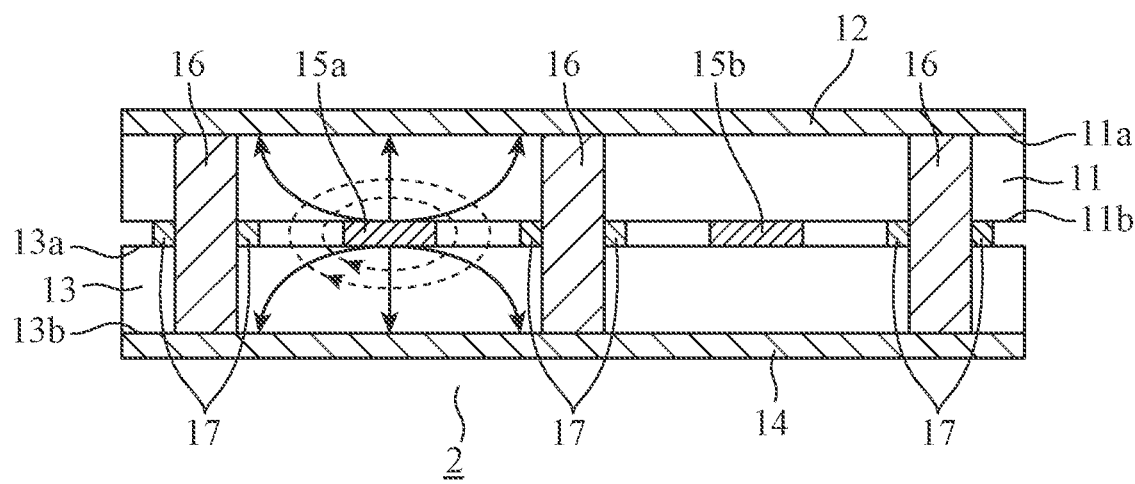
FIG. 3 is a cross-sectional view illustrating a cross section taken along line $A_1$-$A_2$ of a printed circuit board 2 included in the high-frequency circuit 1 according to the first embodiment.

FIG. 3 is a cross-sectional view illustrating a cross section taken along line $A_1$-$A_2$ of a printed circuit board 2 included in the high-frequency circuit 1 according to the first embodiment.

Figure 4:
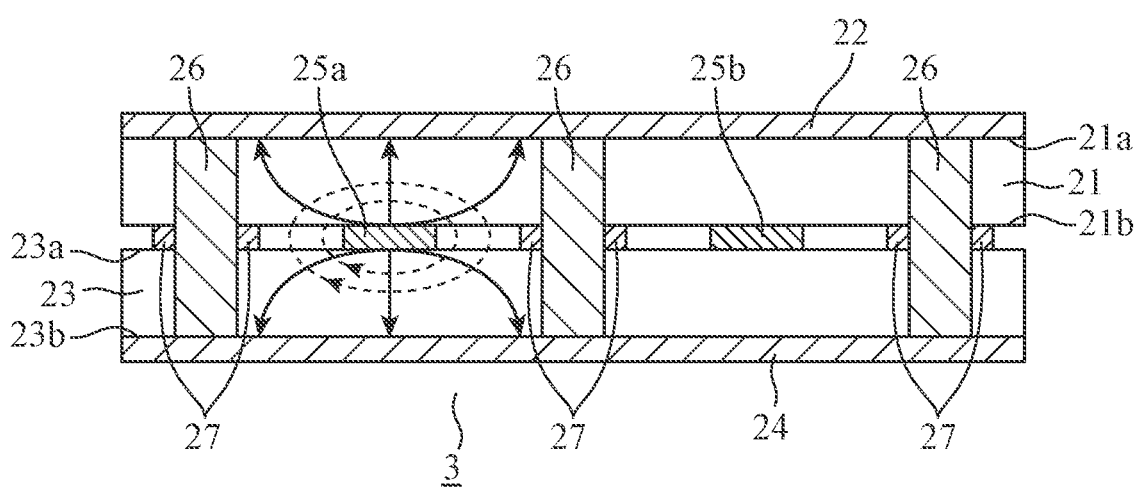
FIG. 4 is a cross-sectional view illustrating a cross section taken along line $B_1$-$B_2$ of a flexible circuit board 3 included in the high-frequency circuit 1 according to the first embodiment.

FIG. 4 is a cross-sectional view illustrating a cross section taken along line $B_1$-$B_2$ of a flexible circuit board 3 included in the high-frequency circuit 1 according to the first embodiment.

FIG. 5 is a cross-sectional view illustrating a cross section taken along line $C_1$-$C_2$ in a connecting portion 4 between the printed circuit board 2 and the flexible circuit board 3.

Figure 5A:
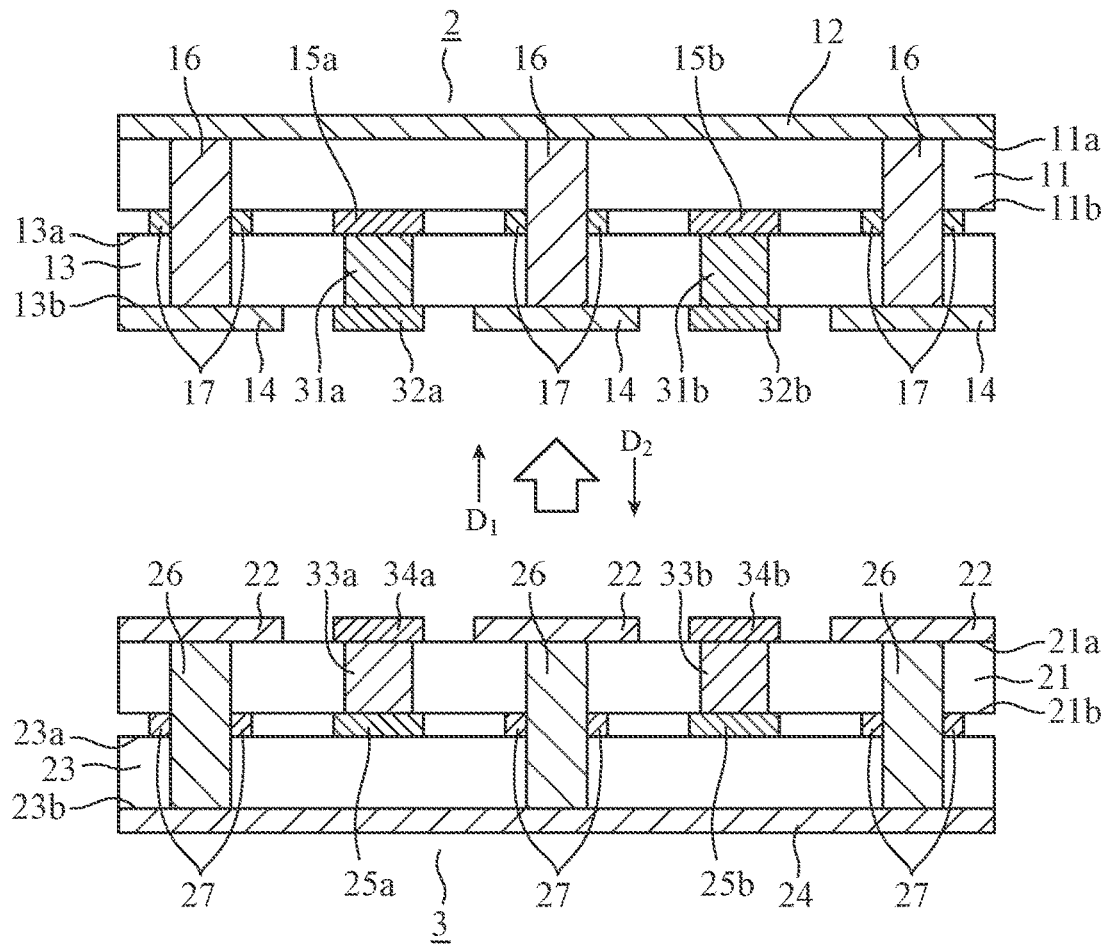
FIG. 5A is a cross-sectional view illustrating a cross section taken along line $C_1$-$C_2$ in a connecting portion 4 before the printed circuit board 2 and the flexible circuit board 3 are connected to each other.
Figure 5B:
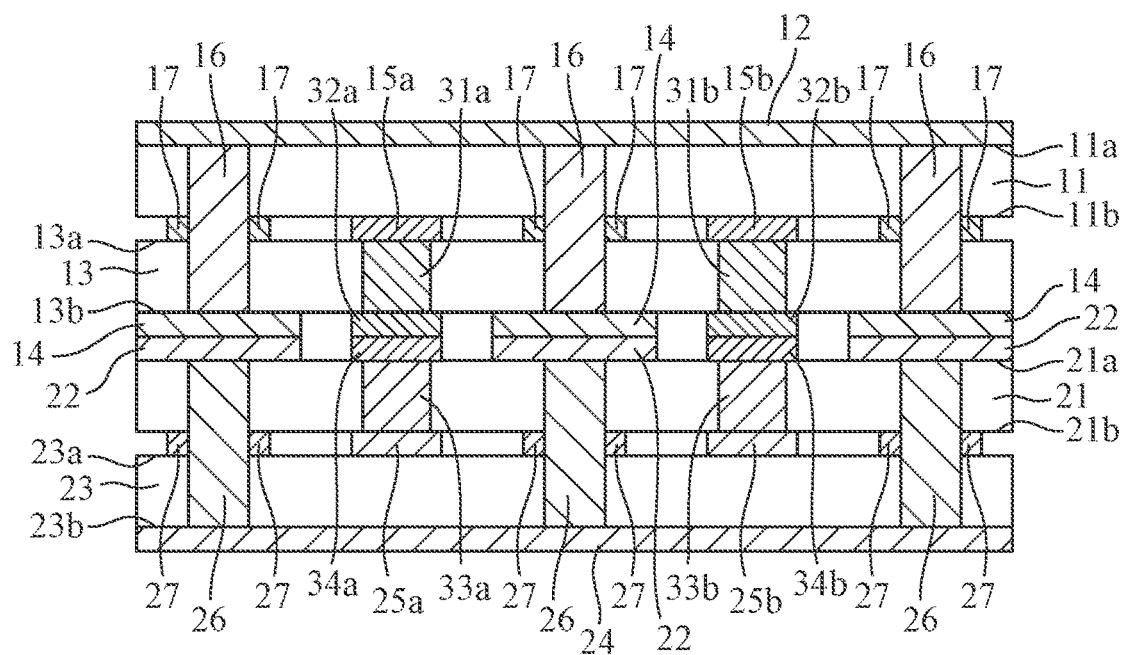
FIG. 5B is a cross-sectional view illustrating a cross section taken along line $C_1$-$C_2$ in the connecting portion 4 where the printed circuit board 2 and the flexible circuit board 3 are connected to each other.

FIG. 5A illustrates a state before the printed circuit board 2 and the flexible circuit board 3 are connected to each other, and FIG. 5B illustrates a state where the printed circuit board 2 and the flexible circuit board 3 are connected to each other.

Figure 6A:
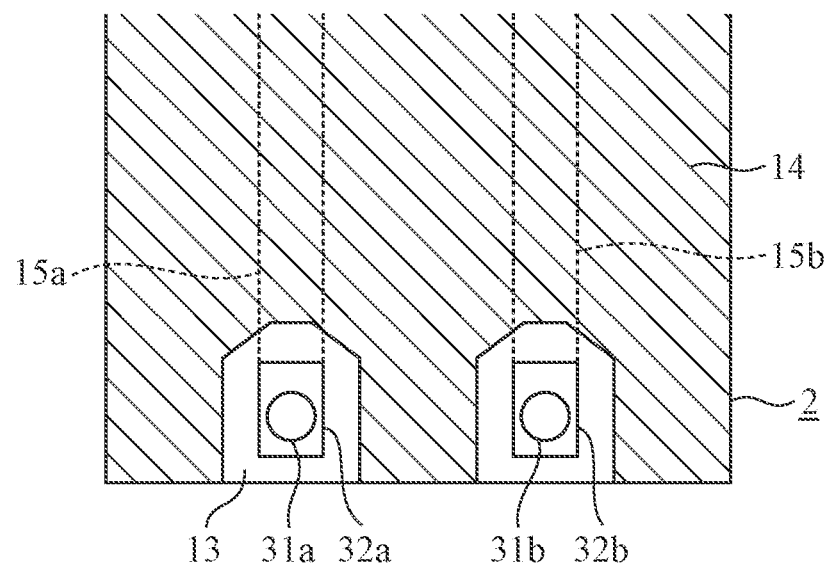
FIG. 6A is a plan view of the printed circuit board 2 illustrated in FIG. 5A as viewed from a direction indicated by arrow $D_1$.

FIG. 6A is a plan view of the printed circuit board 2 illustrated in FIG. 5A as viewed from a direction indicated by arrow $D_1$.

Figure 6B:
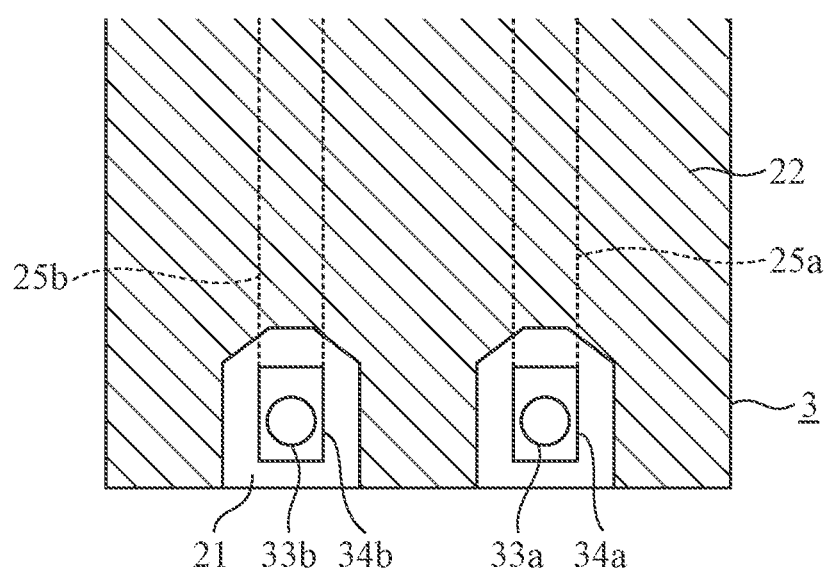
FIG. 6B is a plan view of the flexible circuit board 3 illustrated in FIG. 5A as viewed from a direction indicated by arrow $D_2$.

FIG. 6B is a plan view of the flexible circuit board 3 illustrated in FIG. 5A as viewed from a direction indicated by arrow $D_2$.

The high-frequency circuit 1 includes the printed circuit board 2 and the flexible circuit board 3, and transmits a signal transmitted by a communication module or a signal received by the communication module.

The printed circuit board 2 includes a first dielectric layer 11, a first ground conductor 12, a second dielectric layer 13, a second ground conductor 14, first signal lines 15a and 15b, a first ground connecting conductor 16, and a conductor 17. In FIG. 2, only a part of the printed circuit board 2 is illustrated.

The printed circuit board 2 illustrated in FIGS. 2 and 3 includes two signal lines 15a and 15b as first signal lines. However, this is merely an example, and the printed circuit board 2 may include three or more first signal lines as the first signal lines.

In addition, the printed circuit board 2 may include only one first signal line as the first signal line. Even when the printed circuit board 2 includes only one first signal line, crosstalk may occur between the one first signal line and a signal line (not illustrated) wired outside the printed circuit board 2.

The flexible circuit board 3 is connected to the printed circuit board 2 via the connecting portion 4.

The flexible circuit board 3 includes a third dielectric layer 21, a third ground conductor 22, a fourth dielectric layer 23, a fourth ground conductor 24, second signal lines 25a and 25b, a second ground connecting conductor 26, and a conductor 27.

The flexible circuit board 3 illustrated in FIGS. 2 and 4 includes two signal lines 25a and 25b as second signal lines. However, this is merely an example, and the flexible circuit board 3 may include three or more second signal lines as the second signal lines.

In addition, the flexible circuit board 3 may include only one second signal line as the second signal line. Even when the flexible circuit board 3 includes only one second signal line, crosstalk may occur between the one second signal line and a signal line (not illustrated) wired outside the flexible circuit board 3.

The connecting portion 4 connects the printed circuit board 2 and the flexible circuit board 3 to each other.

The connecting portion 4 includes a first connecting conductor 31a and a second connecting conductor 33a as connecting conductors that electrically connect the first signal line 15a and the second signal line 25a to each other in a non-conductive state with each of the second ground conductor 14 and the third ground conductor 22.

In addition, the connecting portion 4 includes a first connecting conductor 31b and a second connecting conductor 33b as connecting conductors that electrically connect the first signal line 15b and the second signal line 25b to each other in a non-conductive state with each of the second ground conductor 14 and the third ground conductor 22.

The first dielectric layer 11 has a first surface 11a and a second surface 11b.

The first ground conductor 12 is formed on the first surface 11a.

The first ground conductor 12 is a sheet-like conductor formed on the first surface 11a, and is connected to the ground.

The second dielectric layer 13 has a third surface 13a and a fourth surface 13b.

The second ground conductor 14 is formed on the fourth surface 13b.

The second ground conductor 14 is a sheet-like conductor formed on the fourth surface 13b, and is connected to the ground.

Each of the first signal line 15a and the first signal line 15b is wired between the second surface 11b and the third surface 13a.

Each of the first signal line 15a and the first signal line 15b transmits a signal transmitted by the communication module or a signal received by the communication module.

The first ground connecting conductor 16 and the conductor 17 are arranged between the first signal line 15a and the first signal line 15b.

The first ground connecting conductor 16 is disposed between the first signal line 15a and the first signal line 15b.

In addition, the first ground connecting conductor 16 is also disposed around a side on which the first signal line 15b is not disposed out of both sides of the first signal line 15a.

In addition, the first ground connecting conductor 16 is also disposed around a side on which the first signal line 15a is not disposed out of both sides of the first signal line 15b.

A first end of the first ground connecting conductor 16 is connected to the first ground conductor 12, and a second end of the first ground connecting conductor 16 is connected to the second ground conductor 14.

In the high-frequency circuit 1 illustrated in FIG. 2, the first ground connecting conductor 16 is disposed only around the first signal line 15a and the first signal line 15b. However, this is merely an example, and the first ground connecting conductor 16 may be disposed not only around the first signal line 15a and the first signal line 15b but also in a region other than the region around the first signal line 15a and the first signal line 15b.

The conductor 17 is disposed between the second surface 11b and the third surface 13a, and is connected to the first ground connecting conductor 16, for example, in a state where the first ground connecting conductor 16 is inserted into the conductor 17.

The third dielectric layer 21 has a fifth surface 21a and a sixth surface 21b.

The third ground conductor 22 is formed on the fifth surface 21a.

The third ground conductor 22 is a sheet-like conductor formed on the fifth surface 21a, and is connected to the ground.

The fourth dielectric layer 23 has a seventh surface 23a and an eighth surface 23b.

The fourth ground conductor 24 is formed on the eighth surface 23b.

The fourth ground conductor 24 is a sheet-like conductor formed on the eighth surface 23b, and is connected to the ground.

Each of the second signal line 25a and the second signal line 25b is wired between the sixth surface 21b and the seventh surface 23a.

Each of the second signal line 25a and the second signal line 25b transmits a signal transmitted by the communication module or a signal received by the communication module.

The second ground connecting conductor 26 and the conductor 27 are arranged between the second signal line 25a and the second signal line 25b.

The second ground connecting conductor 26 is disposed between the second signal line 25a and the second signal line 25b.

In addition, the second ground connecting conductor 26 is also disposed around a side on which the second signal line 25b is not disposed out of both sides of the second signal line 25a.

In addition, the second ground connecting conductor 26 is also disposed around a side on which the second signal line 25a is not disposed out of both sides of the second signal line 25b.

A first end of the second ground connecting conductor 26 is connected to the third ground conductor 22, and a second end of the second ground connecting conductor 26 is connected to the fourth ground conductor 24.

In the high-frequency circuit 1 illustrated in FIG. 2, the second ground connecting conductor 26 is disposed only around the second signal line 25a and the second signal line 25b. However, this is merely an example, and the second ground connecting conductor 26 may be disposed not only around the second signal line 25a and the second signal line 25b but also in a region other than the region around the second signal line 25a and the second signal line 25b.

The conductor 27 is disposed between the sixth surface 21b and the seventh surface 23a, and is connected to the second ground connecting conductor 26, for example, in a state where the second ground connecting conductor 26 is inserted into the conductor 27.

Each of the first connecting conductor 31a and the second connecting conductor 33a is a conductor for connecting the first signal line 15a and the second signal line 25a.

Each of the first connecting conductor 31a and the second connecting conductor 33a can be achieved by, for example, a through-hole via.

A first end of the first connecting conductor 31a is connected to the first signal line 15a.

A second end 32a of the first connecting conductor 31a is exposed from the fourth surface 13b in a non-conductive state with the second ground conductor 14.

A region where the second end 32a of the first connecting conductor 31a is exposed in the fourth surface 13b is a region where the second ground conductor 14 is not formed.

A first end 34a of the second connecting conductor 33a is exposed from the fifth surface 21a in a non-conductive state with the third ground conductor 22 and connected to the second end 32a of the first connecting conductor 31a.

A second end of the second connecting conductor 33a is connected to the second signal line 25a.

Each of the first connecting conductor 31b and the second connecting conductor 33b is a conductor for connecting the first signal line 15b and the second signal line 25b to each other.

Each of the first connecting conductor 31b and the second connecting conductor 33b is constituted by, for example, a through-hole via.

A first end of the first connecting conductor 31b is connected to the first signal line 15b.

A second end 32b of the first connecting conductor 31b is exposed from the fourth surface 13b in a non-conductive state with the second ground conductor 14.

A region where the second end 32b of the first connecting conductor 31b is exposed in the fourth surface 13b is a region where the second ground conductor 14 is not formed.

A first end 34b of the second connecting conductor 33b is exposed from the fifth surface 21a in a non-conductive state with the third ground conductor 22 and connected to the second end 32b of the first connecting conductor 31b.

A second end of the second connecting conductor 33b is connected to the second signal line 25b.

In the connecting portion 4 illustrated in FIG. 5B, the second ground conductor 14 and the third ground conductor 22 are connected to each other with, for example, solder.

In the connecting portion 4 illustrated in FIG. 5B, the printed circuit board 2 includes the first connecting conductor 31a and the first connecting conductor 31b, and the flexible circuit board 3 includes the second connecting conductor 33a and the second connecting conductor 33b.

The second end 32a of the first connecting conductor 31a and the first end 34a of the second connecting conductor 33a are connected to each other with, for example, solder, and as a result, the first signal line 15a and the second signal line 25a are electrically connected to each other in a non-conductive state with each of the second ground conductor 14 and the third ground conductor 22. In addition, the second end 32b of the first connecting conductor 31b and the first end 34b of the second connecting conductor 33b are connected to each other with, for example, solder, and as a result, the first signal line 15b and the second signal line 25b are electrically connected to each other in a non-conductive state with each of the second ground conductor 14 and the third ground conductor 22.

In the connecting portion 4 illustrated in FIGS. 5A and 5B, the second end of the second connecting conductor 33a is connected to the second signal line 25a, and the second end of the second connecting conductor 33b is connected to the second signal line 25b.

However, this is merely an example, and as illustrated in FIG. 7, a middle between the first end 34a and the second end 35a of the second connecting conductor 33a may be connected to the second signal line 25a, and a middle between the first end 34b and the second end 35b of the second connecting conductor 33b may be connected to the second signal line 25b.

In addition, each of the second end 35a of the second connecting conductor 33a and the second end 35b of the second connecting conductor 33b may be exposed from the eighth surface 23b in a non-conductive state with the fourth ground conductor 24.

A region where each of the second end 35a of the second connecting conductor 33a and the second end 35b of the second connecting conductor 33b is exposed in the eighth surface 23b is a region where the fourth ground conductor 24 is not formed.

FIG. 7 is a cross-sectional view illustrating a cross section taken along line $C_1$-$C_2$ in the connecting portion 4 between the printed circuit board 2 and the flexible circuit board 3.

Figure 7A:
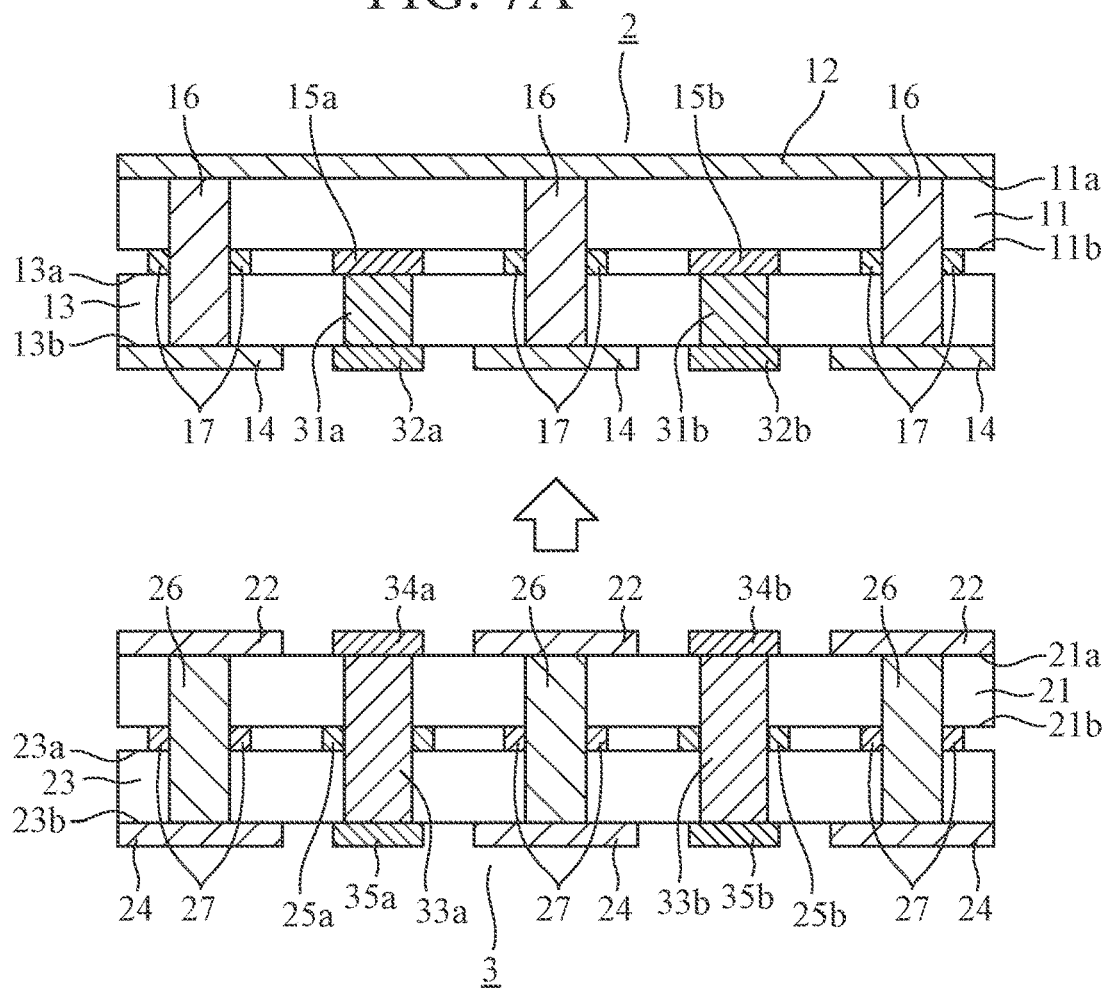
FIG. 7A is a cross-sectional view illustrating a cross section taken along line $C_1$-$C_2$ in the connecting portion 4 before the printed circuit board 2 and the flexible circuit board 3 are connected to each other.
Figure 7B:
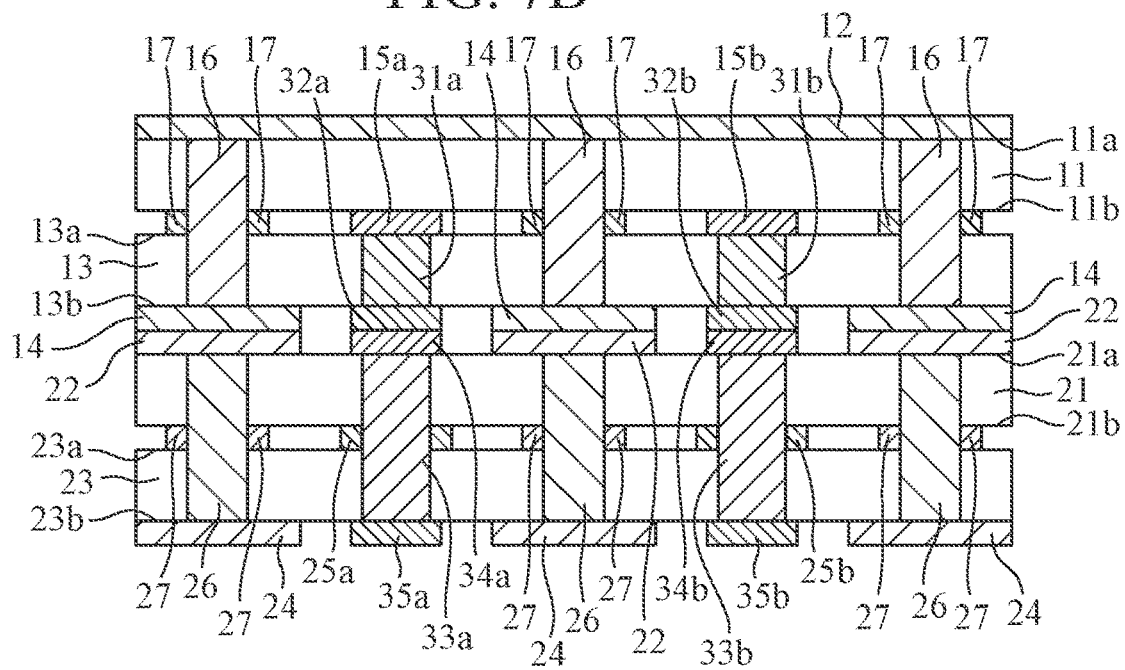
FIG. 7B is a cross-sectional view illustrating a cross section taken along line $C_1$-$C_2$ in the connecting portion 4 where the printed circuit board 2 and the flexible circuit board 3 are connected to each other.

FIG. 7A illustrates a state before the printed circuit board 2 and the flexible circuit board 3 are connected to each other, and FIG. 7B illustrates a state where the printed circuit board 2 and the flexible circuit board 3 are connected to each other.

In the connecting portion 4 illustrated in FIGS. 7A and 7B, as a connecting conductor that electrically connects the first signal line 15a and the second signal line 25a to each other, a through-hole via including the first connecting conductor 31a and the second connecting conductor 33a can be used.

In addition, as a connecting conductor that electrically connects the first signal line 15b and the second signal line 25b to each other, a through-hole via including the first connecting conductor 31b and the second connecting conductor 33b can be used.

In the connecting portion 4 illustrated in FIG. 7B, the second ground conductor 14 and the third ground conductor 22 are connected to each other with, for example, solder, and the second end 32a of the first connecting conductor 31a and the first end 34a of the second connecting conductor 33a are connected to each other with, for example, solder. In addition, the second end 32b of the first connecting conductor 31b and the first end 34b of the second connecting conductor 33b are connected to each other with, for example, solder.

Next, the operation of the high-frequency circuit 1 illustrated in FIG. 1 will be described.

For example, when a signal is input to the first signal line 15a of the printed circuit board 2, the input signal is transmitted through the first signal line 15a.

The signal transmitted through the first signal line 15a is transmitted to the second signal line 25a of the flexible circuit board 3 via the first connecting conductor 31a and the second connecting conductor 33a.

The signal transmitted to the second signal line 25a is transmitted through the second signal line 25a.

When a signal is input to the first signal line 15b of the printed circuit board 2, the input signal is transmitted through the first signal line 15b.

The signal transmitted through the first signal line 15b is transmitted to the second signal line 25b of the flexible circuit board 3 via the first connecting conductor 31b and the second connecting conductor 33b.

The signal transmitted to the second signal line 25b is transmitted through the second signal line 25b.

For example, when a signal is transmitted through the first signal line 15a of the printed circuit board 2, a magnetic field as indicated by the dashed arrow in FIG. 3 is generated.

In addition, when a signal is transmitted through the first signal line 15a, an electric field as indicated by the solid arrow in FIG. 3 is generated.

For example, when the generated electric field leaks to the outside of the printed circuit board 2 and reaches the first signal line 15b, crosstalk occurs between the first signal line 15a and the first signal line 15b.

However, in the printed circuit board 2 illustrated in FIG. 3, since the first ground conductor 12 is formed on the first surface 11a of the first dielectric layer 11, leakage of the generated electric field from the first surface 11a of the first dielectric layer 11 to the outside of the printed circuit board 2 is reduced.

In addition, in the printed circuit board 2 illustrated in FIG. 3, since the second ground conductor 14 is formed on the fourth surface 13b of the second dielectric layer 13, leakage of the generated electric field from the fourth surface 13b of the second dielectric layer 13 to the outside of the printed circuit board 2 is reduced.

In addition, in the printed circuit board 2 illustrated in FIG. 3, each of the first ground connecting conductor 16 and the conductor 17 is arranged between the first signal line 15a and the first signal line 15b, and each of the first ground connecting conductor 16 and the conductor 17 acts to cut off the generated electric field. Since each of the first ground connecting conductor 16 and the conductor 17 is arranged, the generated electric field is suppressed from directly reaching the first signal line 15b without passing through the outside of the printed circuit board 2.

Therefore, in the printed circuit board 2 illustrated in FIG. 3, crosstalk between the first signal line 15a and the first signal line 15b can be reduced.

For example, when a signal is transmitted through the second signal line 25a of the flexible circuit board 3, a magnetic field as indicated by the dashed arrow in FIG. 4 is generated.

In addition, when a signal is transmitted through the second signal line 25a, an electric field as indicated by the solid arrow in FIG. 4 is generated.

For example, when the generated electric field leaks to the outside of the flexible circuit board 3 and reaches the second signal line 25b, crosstalk occurs between the second signal line 25a and the second signal line 25b.

However, in the flexible circuit board 3 illustrated in FIG. 4, since the third ground conductor 22 is formed on the fifth surface 21a of the third dielectric layer 21, leakage of the generated electric field from the fifth surface 21a of the third dielectric layer 21 to the outside of the flexible circuit board 3 is reduced.

In addition, in the flexible circuit board 3 illustrated in FIG. 4, since the fourth ground conductor 24 is formed on eighth surface 23b of the fourth dielectric layer 23, leakage of the generated electric field from the eighth surface 23b of the fourth dielectric layer 23 to the outside of the flexible circuit board 3 is reduced.

In addition, in the flexible circuit board 3 illustrated in FIG. 4, each of the second ground connecting conductor 26 and the conductor 27 is arranged between the second signal line 25a and the second signal line 25b, and each of the second ground connecting conductor 26 and the conductor 27 acts to cut off the generated electric field. Since each of the second ground connecting conductor 26 and the conductor 27 is arranged, the generated electric field is suppressed from directly reaching the second signal line 25b without passing through the outside of the flexible circuit board 3.

Therefore, in the flexible circuit board 3 illustrated in FIG. 4, crosstalk between the second signal line 25a and the second signal line 25b can be reduced.

For example, when a signal is transmitted through the first signal line 15a of the printed circuit board 2, an electric field is generated from the first signal line 15a also in the connecting portion 4.

For example, when the generated electric field leaks to the outside of the printed circuit board 2 and reaches the first signal line 15b, crosstalk occurs between the first signal line 15a and the first signal line 15b.

However, in the printed circuit board 2 illustrated in FIG. 5B, since the first ground conductor 12 is formed on the first surface 11a of the first dielectric layer 11, leakage of the generated electric field from the first surface 11a of the first dielectric layer 11 to the outside of the printed circuit board 2 is reduced.

In addition, in the printed circuit board 2 illustrated in FIG. 5B, since the second ground conductor 14 is formed on the fourth surface 13b of the second dielectric layer 13, leakage of the generated electric field from the fourth surface 13b of the second dielectric layer 13 to the outside of the printed circuit board 2 is reduced.

In the connecting portion 4, there is a gap between the second end 32a of the first connecting conductor 31a and the second ground conductor 14, and an electric field may leak from the gap to the outside. However, the generated electric field is concentrated in a region where a conductor is present, and is hardly concentrated in a region where no conductor is present. Therefore, since most of the generated electric field is concentrated in a region where the first ground conductor 12 and the second ground conductor 14 are formed, there will be only slight electric field leaking outside through the gap where the conductor is not formed.

For example, when a signal is transmitted through the second signal line 25a of the flexible circuit board 3, an electric field is generated from the second signal line 25a also in the connecting portion 4.

For example, when the generated electric field leaks to the outside of printed circuit board 2 and reaches the second signal line 25b, crosstalk occurs between the second signal line 25a and the second signal line 25b.

However, in the flexible circuit board 3 illustrated in FIG. 5B, since the fourth ground conductor 24 is formed on the eighth surface 23b of the fourth dielectric layer 23, leakage of the generated electric field from the eighth surface 23b of the fourth dielectric layer 23 to the outside of the flexible circuit board 3 is reduced.

In addition, in the flexible circuit board 3 illustrated in FIG. 5B, since the third ground conductor 22 is formed on the fifth surface 21a of the third dielectric layer 21, leakage of the generated electric field from the fifth surface 21a of the third dielectric layer 21 to the outside of the flexible circuit board 3 is reduced.

In the connecting portion 4, there is a gap between the first end 34a of the second connecting conductor 33a and the third ground conductor 22, and an electric field may leak from the gap to the outside. However, since most of the generated electric field is concentrated in a region where the third ground conductor 22 and the fourth ground conductor 24 are formed, there will be only slight electric field leaking outside through the gap where the conductor is not formed.

FIG. 8 is an explanatory diagram illustrating a simulation result of crosstalk caused by leakage of an electric field from the connecting portion 4.

In FIG. 8, the horizontal axis represents a frequency [GHz] of a signal transmitted through each of the first signal line 15a and the second signal line 25a, and the vertical axis represents crosstalk [dB].

The alternate long and short dash line indicates crosstalk caused from the connecting portion 4 of the high-frequency circuit 1 illustrated in FIG. 2.

The solid line indicates crosstalk caused from the connecting portion 4 of the high-frequency circuit 1 when the printed circuit board 2 does not include the first ground conductor 12 or the second ground conductor 14 and the flexible circuit board 3 does not include the third ground conductor 22 or the fourth ground conductor 24.

The broken line indicates crosstalk caused from the connecting portion 4 of the high-frequency circuit 1 when the flexible circuit board 3 includes the third ground conductor 22 and the fourth ground conductor 24 but the printed circuit board 2 does not include the first ground conductor 12 or the second ground conductor 14.

As illustrated in FIG. 8, it can be seen that the crosstalk caused from the connecting portion 4 of the high-frequency circuit 1 illustrated in FIG. 2 is reduced as compared with the crosstalk caused from the connecting portion 4 of the high-frequency circuit 1 when the flexible circuit board 3 does not include the third ground conductor 22 or the fourth ground conductor 24.

In addition, as illustrated in FIG. 8, it can be seen that the crosstalk caused from the connecting portion 4 of the high-frequency circuit 1 illustrated in FIG. 2 is reduced as compared with the crosstalk caused from the connecting portion 4 of the high-frequency circuit 1 when the printed circuit board 2 does not include the first ground conductor 12 or the second ground conductor 14.

In the first embodiment described above, the high-frequency circuit 1 is configured in such a manner that the printed circuit board 2 includes the first dielectric layer 11 in which the first ground conductor 12 is formed on the first surface 11a, the flexible circuit board 3 includes the fourth dielectric layer 23 in which the fourth ground conductor 24 is formed on the eighth surface 23b, and the connecting portion 4 between the printed circuit board 2 and the flexible circuit board 3 includes connecting conductors that electrically connect the first signal lines 15a and 15b and the second signal lines 25a and 25b to each other in a non-conductive state with each of the second ground conductor 14 and the third ground conductor 22.

In addition, in the high-frequency circuit 1, the connecting portion 4 between the printed circuit board 2 and the flexible circuit board 3 includes: the first connecting conductors 31a and 31b each having the first end connected to each of the first signal lines 15a and 15b and the second end exposed from the fourth surface 13b in a non-conductive state with the second ground conductor 14; and the second connecting conductors 33a and 33b each having the first end exposed from the fifth surface 21a in a non-conductive state with the third ground conductor 22 and connected to the second end of each of the first connecting conductors 31a and 31b, and the second end connected to each of the second signal lines 25a and 25b. Therefore, the high-frequency circuit 1 can suppress leakage of an electric field from the connecting portion 4 between the printed circuit board 2 and the flexible circuit board 3.

Second Embodiment

In the flexible circuit board 3 illustrated in FIG. 4, the third ground conductor 22 is formed on the fifth surface 21a of the third dielectric layer 21.

In a second embodiment, a high-frequency circuit 1 including a flexible circuit board 3 in which regions 41a and 41b facing regions where second signal lines 25a and 25b are wired in a fifth surface 21a of a third dielectric layer 21 are regions where a third ground conductor 22 is not formed will be described.

FIG. 9 is a cross-sectional view illustrating a cross section taken along line $B_1$-$B_2$ of the flexible circuit board 3 included in the high-frequency circuit 1 according to the second embodiment. In FIG. 9, the same reference numerals as in FIG. 4 indicate the same or corresponding parts, and therefore description thereof is omitted.

The region 41a is a region facing a region where the second signal line 25a is wired in the fifth surface 21a of the third dielectric layer 21, and the third ground conductor 22 is not formed in the region 41a.

The region 41b is a region facing a region where the second signal line 25b is wired in the fifth surface 21a of the third dielectric layer 21, and the third ground conductor 22 is not formed in the region 41b.

When the regions 41a and 41b where the third ground conductor 22 is not formed are present in the fifth surface 21a of the third dielectric layer 21, an electric field may leak from the regions 41a and 41b to the outside.

However, since most of the generated electric field is concentrated in a region where the third ground conductor 22 is formed, there will be only slight electric field leaking outside through the regions 41a and 41b where the conductor is not formed. Therefore, leakage of the electric field to the outside can be suppressed more than a flexible circuit board in which the third ground conductor 22 is not formed on the fifth surface 21a of the third dielectric layer 21.

For example, in the configuration of FIG. 4, when a signal is transmitted through the second signal line 25a of the flexible circuit board 3, as described above, simultaneously with generation of an electric field, a capacitive component is generated between the second signal line 25a and the third ground conductor 22, and a capacitive component is generated between the second signal line 25a and the fourth ground conductor 24. As the second signal line 25a, for example, a line having an impedance of 50Ω is preferable, and in order to cancel a generated capacitive component and obtain a desired impedance, for example, it is only required to narrow the line width of the second signal line 25a and increase an inductance component.

However, when the line width of the second signal line 25a is narrowed, there is a high possibility that the second signal line 25a is disconnected when the flexible circuit board 3 is bent, and therefore it may be difficult to narrow the line width of the second signal line 25a.

In the flexible circuit board 3 illustrated in FIG. 4, the third ground conductor 22 is formed on the entire fifth surface 21a of the third dielectric layer 21, but in the flexible circuit board 3 illustrated in FIG. 9, the third ground conductor 22 is not formed in the regions 41a and 41b in the fifth surface 21a.

Therefore, the area of the third ground conductor 22 included in the flexible circuit board 3 illustrated in FIG. 9 is smaller than the area of the third ground conductor 22 included in the flexible circuit board 3 illustrated in FIG. 4.

In the flexible circuit board 3 illustrated in FIG. 9, since the area of the third ground conductor 22 is smaller than that of the flexible circuit board 3 illustrated in FIG. 4, the capacitive component generated between the second signal lines 25a and 25b and the third ground conductor 22 is reduced as compared with that in the flexible circuit board 3 illustrated in FIG. 4.

In the flexible circuit board 3 illustrated in FIG. 9, since the generated capacitive component is reduced as compared with that in the flexible circuit board 3 illustrated in FIG. 4, it may be possible to cancel the capacitive component without increasing the inductance components of the second signal lines 25a and 25b by narrowing the line widths of the second signal lines 25a and 25b.

In the second embodiment described above, the high-frequency circuit 1 is configured in such a manner that the regions 41a and 41b facing regions where the second signal lines 25a and 25b are wired in the fifth surface 21a are regions where the third ground conductor 22 is not formed. Therefore, the high-frequency circuit 1 can suppress leakage of an electric field from the connecting portion 4 between the printed circuit board 2 and the flexible circuit board 3, and also can widen the line widths of the second signal lines 25a and 25b as compared with the high-frequency circuit 1 illustrated in FIG. 2.

Third Embodiment

In the flexible circuit board 3 illustrated in FIG. 4, the third ground conductor 22 is formed on the fifth surface 21a of the third dielectric layer 21.

In a third embodiment, a region 41a facing a region where a second signal line 25a is wired in a fifth surface 21a is a region where a third ground conductor 22 is not formed. A high-frequency circuit 1 including a flexible circuit board 3 in which a region 41c facing a region where a second signal line 25b is wired in an eighth surface 23b is a region where a fourth ground conductor 24 is not formed will be described.

Figure 10:
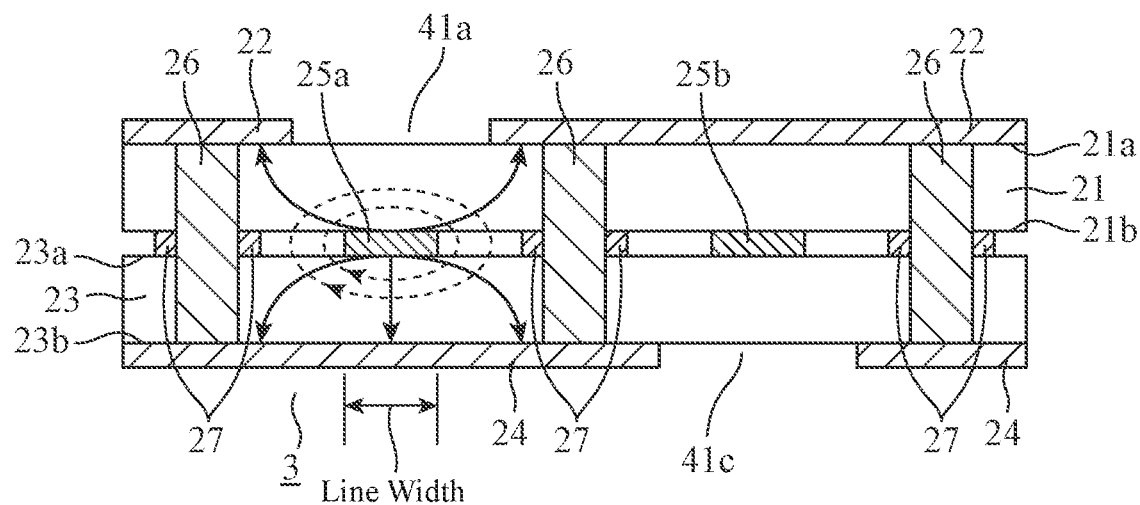
FIG. 10 is a cross-sectional view illustrating a cross section taken along line $B_1$-$B_2$ of a flexible circuit board 3 included in a high-frequency circuit 1 according to a third embodiment.

FIG. 10 is a cross-sectional view illustrating a cross section taken along line $B_1$-$B_2$ of the flexible circuit board 3 included in the high-frequency circuit 1 according to the third embodiment. In FIG. 10, the same reference numerals as in FIGS. 4 and 9 indicate the same or corresponding parts, and therefore description thereof is omitted.

The region 41c is a region facing a region where the second signal line 25b is wired in the eighth surface 23b of a fourth dielectric layer 23, and the fourth ground conductor 24 is not formed in the region 41c.

The second signal line 25a and the second signal line 25b are signal lines adjacent to each other among two or more second signal lines.

In the flexible circuit board 3 illustrated in FIG. 4, the third ground conductor 22 is formed on the entire fifth surface 21a of the third dielectric layer 21, and the fourth ground conductor 24 is formed on the entire eighth surface 23b of the fourth dielectric layer 23.

Meanwhile, in the flexible circuit board 3 illustrated in FIG. 10, the third ground conductor 22 is not formed in the region 41a in the fifth surface 21a. In addition, the fourth ground conductor 24 is not formed in the region 41c in the eighth surface 23b.

Therefore, the area of the third ground conductor 22 included in the flexible circuit board 3 illustrated in FIG. 10 is smaller than the area of the third ground conductor 22 included in the flexible circuit board 3 illustrated in FIG. 4.

In addition, the area of the fourth ground conductor 24 included in the flexible circuit board 3 illustrated in FIG. 10 is smaller than the area of the fourth ground conductor 24 included in the flexible circuit board 3 illustrated in FIG. 4.

In the flexible circuit board 3 illustrated in FIG. 10, since the area of the third ground conductor 22 is smaller than that of the flexible circuit board 3 illustrated in FIG. 4, the capacitive component generated between the second signal line 25a and the third ground conductor 22 is reduced as compared with that in the flexible circuit board 3 illustrated in FIG. 4.

In addition, in the flexible circuit board 3 illustrated in FIG. 10, since the area of the fourth ground conductor 24 is smaller than that of the flexible circuit board 3 illustrated in FIG. 4, the capacitive component generated between the second signal line 25b and the fourth ground conductor 24 is reduced as compared with that in the flexible circuit board 3 illustrated in FIG. 4.

In the flexible circuit board 3 illustrated in FIG. 10, since the generated capacitive component is reduced as compared with that in the flexible circuit board 3 illustrated in FIG. 4, it may be possible to cancel the capacitive component without increasing the inductance components of the second signal lines 25a and 25b by narrowing the line widths of the second signal lines 25a and 25b.

In addition, in the flexible circuit board 3 illustrated in FIG. 10, since the region 41a is formed on the fifth surface 21a and the region 41c is formed on the eighth surface 23b, even if an electric field leaks from the region 41a to the outside, it is difficult for the electric field to reach the region 41c. Therefore, in the flexible circuit board 3 illustrated in FIG. 10, occurrence of crosstalk between the second signal line 25a and the second signal line 25b can be suppressed more than in the flexible circuit board 3 illustrated in FIG. 9.

In the third embodiment described above, the region 41a facing a region where the second signal line 25a is wired in the fifth surface 21a is a region where the third ground conductor 22 is not formed. The high-frequency circuit 1 is configured in such a manner that the region 41c facing a region where the second signal line 25b is wired in the eighth surface 23b is a region where the fourth ground conductor 24 is not formed. Therefore, the high-frequency circuit 1 can suppress leakage of an electric field from the connecting portion 4 between the printed circuit board 2 and the flexible circuit board 3, and also can widen the line widths of the second signal lines 25a and 25b as compared with the high-frequency circuit 1 illustrated in FIG. 2.

Fourth Embodiment

In the printed circuit board 2 illustrated in FIG. 3, the first ground conductor 12 is formed on the first surface 11a of the first dielectric layer 11.

In a fourth embodiment, a high-frequency circuit 1 including a printed circuit board 2 in which regions 51a and 51b facing regions where first signal lines 15a and 15b are wired in a first surface 11a of a first dielectric layer 11 are regions where a first ground conductor 12 is not formed will be described.

Figure 11:
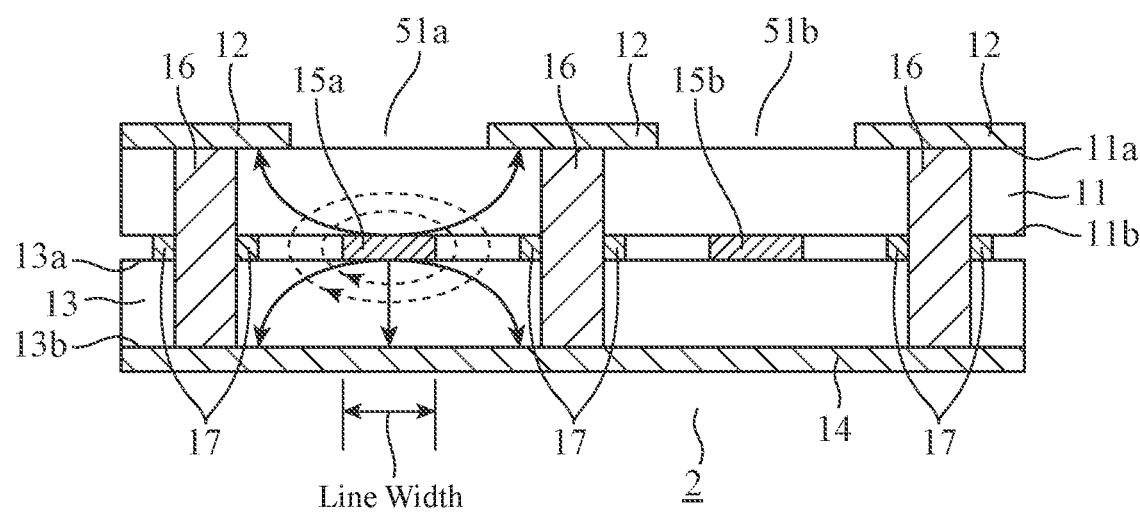
FIG. 11 is a cross-sectional view illustrating a cross section taken along line $A_1$-$A_2$ of a printed circuit board 2 included in a high-frequency circuit 1 according to a fourth embodiment.

FIG. 11 is a cross-sectional view illustrating a cross section taken along line $A_1$-$A_2$ of the printed circuit board 2 included in the high-frequency circuit 1 according to the fourth embodiment. In FIG. 11, the same reference numerals as in FIG. 3 indicate the same or corresponding parts, and therefore description thereof is omitted.

The region 51a is a region facing a region where the first signal line 15a is wired in the first surface 11a of the first dielectric layer 11, and the first ground conductor 12 is not formed in the region 51a.

The region 51b is a region facing a region where the first signal line 15b is wired in the first surface 11a of the first dielectric layer 11, and the first ground conductor 12 is not formed in the region 51b.

When the regions 51a and 51b in which the first ground conductor 12 is not formed are present in the first surface 11a of the first dielectric layer 11, an electric field may leak from the regions 51a and 51b to the outside.

However, since most of the generated electric field is concentrated in a region where the first ground conductor 12 is formed, there will be only slight electric field leaking outside through the regions 51a and 51b where the conductor is not formed. Therefore, leakage of the electric field to the outside can be suppressed more than in a printed circuit board in which the first ground conductor 12 is not formed on the first surface 11a of the first dielectric layer 11.

For example, when a signal is transmitted through the first signal line 15a of the printed circuit board 2, an electric field is generated as described above.

By generation of the electric field, a capacitive component is generated between the first signal line 15a and the first ground conductor 12, and a capacitive component is generated between the first signal line 15a and the second ground conductor 14. As the first signal line 15a, for example, a line having an impedance of 50Ω is preferable, and in order to cancel a generated capacitive component and obtain a desired impedance, for example, it is only required to narrow the line width of the first signal line 15a and increase an inductance component.

However, when the line width of the first signal line 15a is narrowed, the line impedance of the first signal line 15a cannot be a desired impedance in some cases depending on manufacturing constraints and the like.

In the printed circuit board 2 illustrated in FIG. 3, the first ground conductor 12 is formed on the entire first surface 11a of the first dielectric layer 11, but in the printed circuit board 2 illustrated in FIG. 11, the first ground conductor 12 is not formed in the regions 51a and 51b in the first surface 11a.

Therefore, the area of the first ground conductor 12 included in the printed circuit board 2 illustrated in FIG. 11 is smaller than the area of the first ground conductor 12 included in the printed circuit board 2 illustrated in FIG. 3.

In the printed circuit board 2 illustrated in FIG. 11, since the area of the first ground conductor 12 is smaller than that of the printed circuit board 2 illustrated in FIG. 3, the capacitive component generated between the first signal lines 15a and 15b and the first ground conductor 12 is reduced as compared with that in the printed circuit board 2 illustrated in FIG. 3.

In the printed circuit board 2 illustrated in FIG. 11, since the generated capacitive component is reduced as compared with that in the printed circuit board 2 illustrated in FIG. 3, it may be possible to cancel the capacitive component without increasing the inductance components of the first signal lines 15a and 15b by narrowing the line widths of the first signal lines 15a and 15b.

In the fourth embodiment described above, the high-frequency circuit 1 is configured in such a manner that the regions 51a and 51b facing regions where the first signal lines 15a and 15b are wired in the first surface 11a are regions where the first ground conductor 12 is not formed. Therefore, the high-frequency circuit 1 can suppress leakage of an electric field from the connecting portion 4 between the printed circuit board 2 and the flexible circuit board 3, and also can widen the line widths of the first signal lines 15a and 15b as compared with the high-frequency circuit 1 illustrated in FIG. 2.

Fifth Embodiment

In a fifth embodiment, a high-frequency circuit 1 including a flexible circuit board 3 in which the thickness of a third dielectric layer 21 is different from the thickness of a fourth dielectric layer 23 will be described.

Figure 12A:
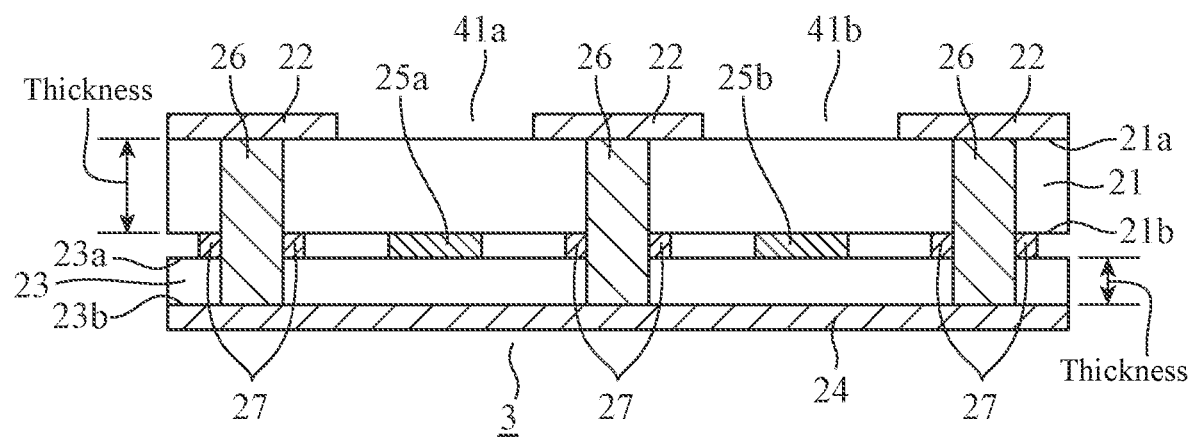
FIGS. 12A and 12B are cross-sectional views each illustrating a cross section taken along line $B_1$-$B_2$ of a flexible circuit board 3 included in a high-frequency circuit 1 according to a fifth embodiment.

FIG. 12A is a cross-sectional view illustrating a cross section taken along line $B_1$-$B_2$ of the flexible circuit board 3 included in the high-frequency circuit 1 according to the fifth embodiment. In the example of FIG. 12A, the thickness of the third dielectric layer 21 is larger than the thickness of the fourth dielectric layer 23.

Figure 12B:
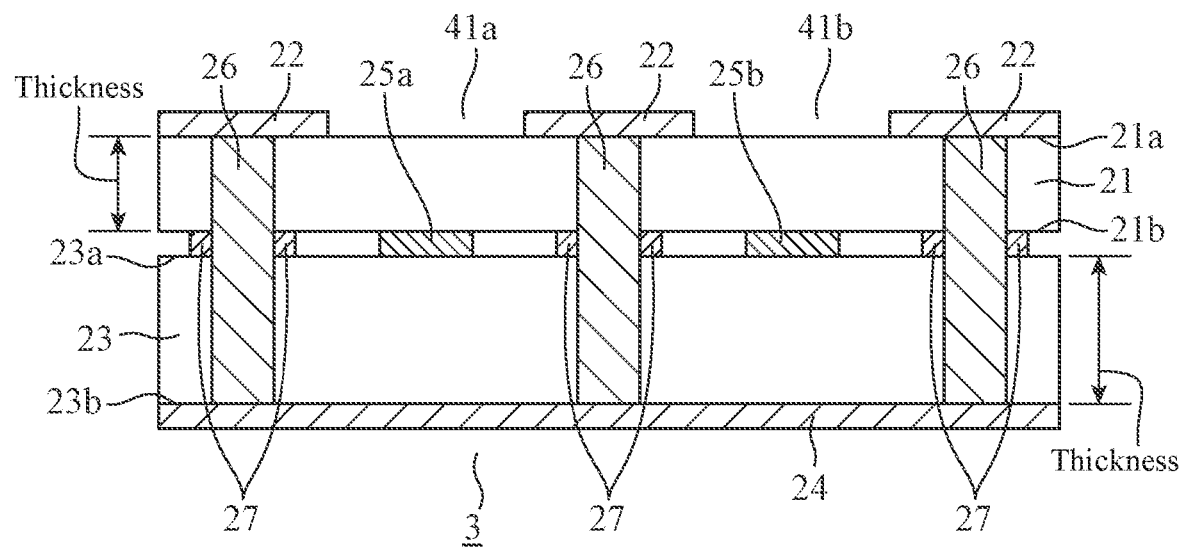

FIG. 12B is a cross-sectional view illustrating a cross section taken along line $B_1$-$B_2$ of the flexible circuit board 3 included in the high-frequency circuit 1 according to the fifth embodiment. In the example of FIG. 12B, the thickness of the third dielectric layer 21 is smaller than the thickness of the fourth dielectric layer 23.

When the thickness of the fourth dielectric layer 23 is smaller than the thickness of the third dielectric layer 21 without changing the thickness of the third dielectric layer 21 as illustrated in FIG. 12A, a capacitive component generated between the second signal lines 25a and 25b and the fourth ground conductor 24 is larger than that when the thickness of the fourth dielectric layer 23 is the same as the thickness of the third dielectric layer 21.

Therefore, even when the thickness of the fourth dielectric layer 23 is smaller than the thickness of the third dielectric layer 21, in order to cancel the capacitive component, it is necessary to narrow the line widths of the second signal lines 25a and 25b as compared with that when the thickness of the fourth dielectric layer 23 is the same as the thickness of the third dielectric layer 21.

When the thickness of the fourth dielectric layer 23 is larger than the thickness of the third dielectric layer 21 without changing the thickness of the third dielectric layer 21 as illustrated in FIG. 12B, a capacitive component generated between the second signal lines 25a and 25b and the fourth ground conductor 24 is smaller than that when the thickness of the fourth dielectric layer 23 is the same as the thickness of the third dielectric layer 21.

Therefore, even when the thickness of the fourth dielectric layer 23 is larger than the thickness of the third dielectric layer 21, in order to cancel the capacitive component, it is necessary to widen the line widths of the second signal lines 25a and 25b as compared with that when the thickness of the fourth dielectric layer 23 is the same as the thickness of the third dielectric layer 21.

Therefore, in the flexible circuit board 3 illustrated in FIGS. 12A and 12B, it is only required to determine the line widths of the second signal lines 25a and 25b depending on the thickness of the third dielectric layer 21 and the thickness of the fourth dielectric layer 23, respectively.

Here, it is described that the line widths of the second signal lines 25a and 25b are determined depending on the thickness of the third dielectric layer 21 and the thickness of the fourth dielectric layer 23, respectively. However, this is merely an example, and after the line widths of the second signal lines 25a and 25b are determined to be desired line widths, each of the thickness of the third dielectric layer 21 and the thickness of the fourth dielectric layer 23 may be determined in such a manner that a capacitive component generated between the second signal lines 25a and 25b and the fourth ground conductor 24 can be canceled.

In the flexible circuit board 3 illustrated in FIGS. 12A and 12B, the thickness of the fourth dielectric layer 23 is different from the thickness of the third dielectric layer 21 without changing the thickness of the third dielectric layer 21.

However, this is merely an example, and the flexible circuit board 3 may be configured in such a manner that the thickness of the third dielectric layer 21 is different from the thickness of the fourth dielectric layer 23 without changing the thickness of the fourth dielectric layer 23.

In the fifth embodiment described above, the high-frequency circuit 1 is configured in such a manner that the thickness of the third dielectric layer 21 is different from the thickness of the fourth dielectric layer 23. Therefore, the high-frequency circuit 1 can suppress leakage of an electric field from the connecting portion 4 between the printed circuit board 2 and the flexible circuit board 3, and also can increase the degree of freedom in designing the line widths of the second signal lines 25a and 25b as compared with the high-frequency circuit 1 illustrated in FIG. 2.

Sixth Embodiment

In a sixth embodiment, a high-frequency circuit in which a connection position between a first signal line 15a and a second signal line 25a is different from a connection position between a first signal line 15b and a second signal line 25b in a signal transmission direction on a flexible circuit board will be described.

Figure 13:
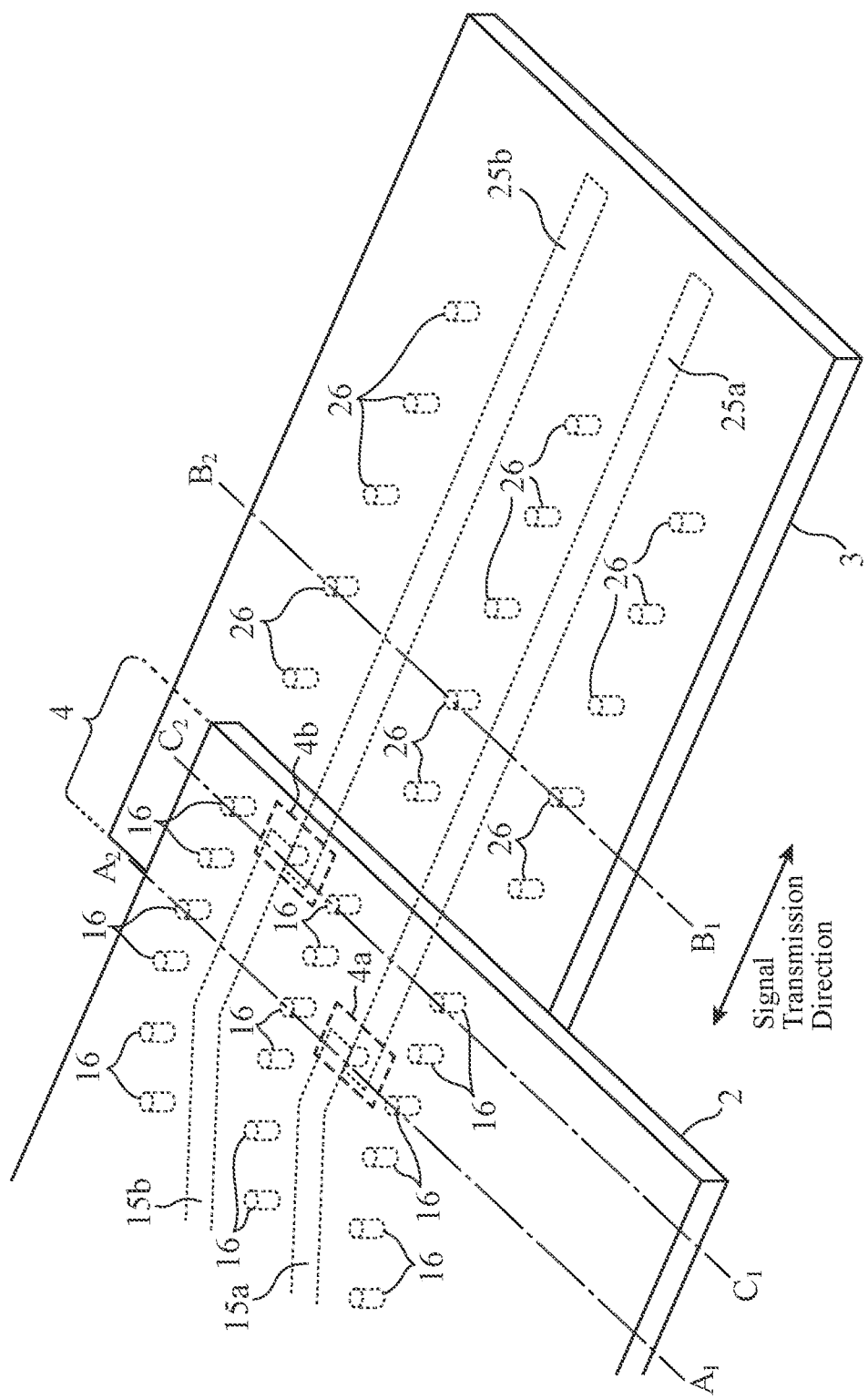
FIG. 13 is a perspective view illustrating a high-frequency circuit 1 according to a sixth embodiment.

FIG. 13 is a perspective view illustrating a high-frequency circuit 1 according to the sixth embodiment. In FIG. 13, the same reference numerals as in FIG. 2 indicate the same or corresponding parts, and therefore description thereof is omitted.

A connecting portion 4 includes a first connecting portion 4a and a second connecting portion 4b.

The first connecting portion 4a includes a first connecting conductor 31a and a second connecting conductor 33a in order to electrically connect the first signal line 15a and the second signal line 25a to each other.

The second connecting portion 4b includes a first connecting conductor 31b and a second connecting conductor 33b in order to electrically connect the first signal line 15b and the second signal line 25b to each other.

In the high-frequency circuit 1 illustrated in FIG. 13, the position where the first connecting portion 4a is disposed is different from the position where the second connecting portion 4b is disposed in a signal transmission direction in a flexible circuit board 3.

When the position where the first connecting portion 4a is disposed is different from the position where the second connecting portion 4b is disposed, a distance between the position where the first connecting portion 4a is disposed and the position where the second connecting portion 4b is disposed is longer than that when the position where the first connecting portion 4a is disposed is the same as the position where the second connecting portion 4b is disposed.

Therefore, in the high-frequency circuit 1 illustrated in FIG. 13, even if an electric field leaks from the first connecting portion 4a or the second connecting portion 4b to the outside, occurrence of crosstalk between the first signal line 15a and the first signal line 15b can be suppressed more than when the position where the first connecting portion 4a is disposed is the same as the position where the second connecting portion 4b is disposed. In addition, occurrence of crosstalk between the second signal line 25a and the second signal line 25b can be suppressed.

In the sixth embodiment described above, the high-frequency circuit 1 is configured in such a manner that the position where the first connecting portion 4a is disposed is different from the position where the second connecting portion 4b is disposed in a signal transmission direction in the flexible circuit board 3. Therefore, the high-frequency circuit 1 can suppress leakage of an electric field from the connecting portion 4 between the printed circuit board 2 and the flexible circuit board 3, and also can suppress occurrence of crosstalk more than the high-frequency circuit 1 illustrated in FIG. 2.

Seventh Embodiment

In a seventh embodiment, a high-frequency circuit 1 in which openings 61a and 61b are formed in a first ground conductor 12 will be described.

Figure 14:
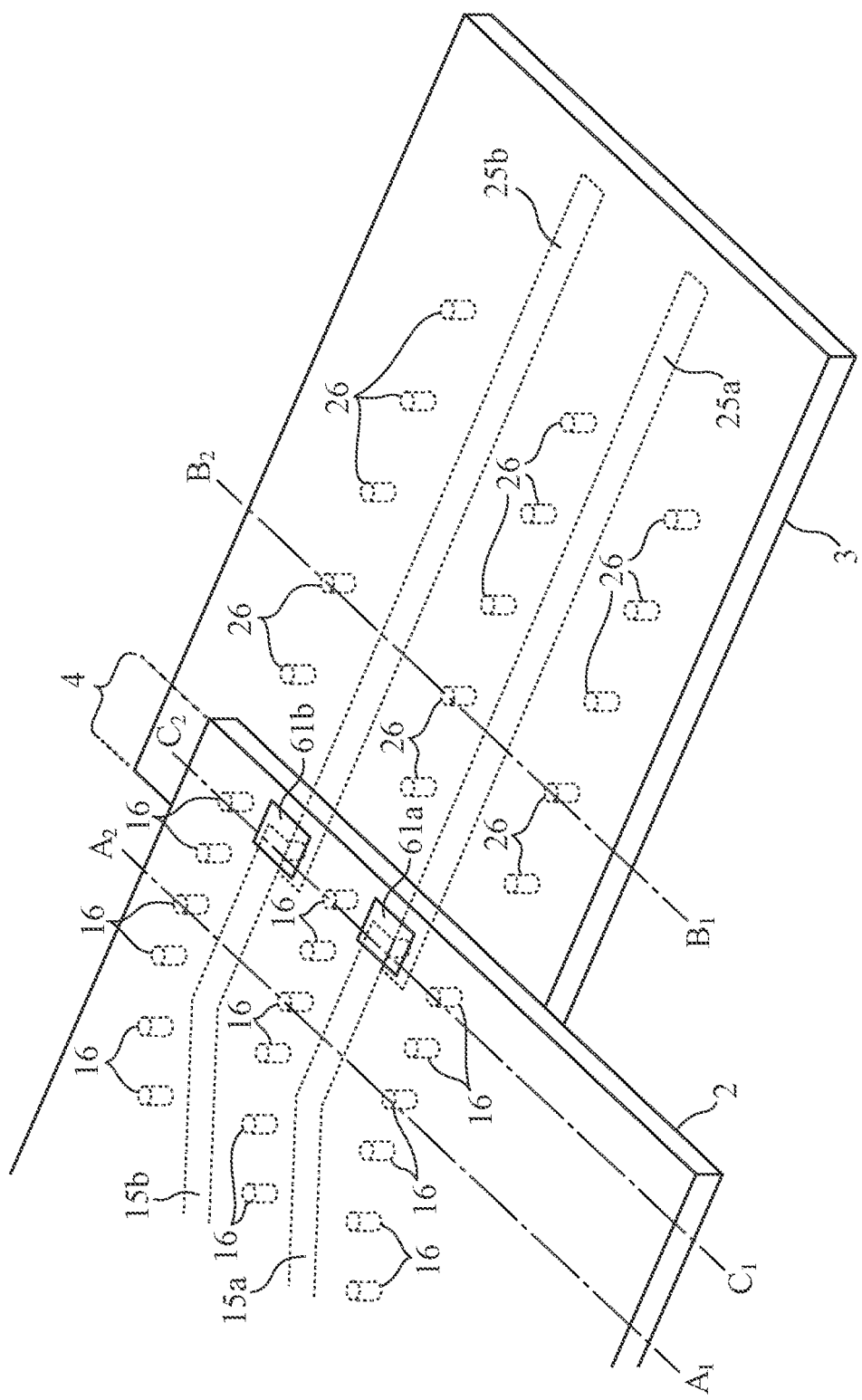
FIG. 14 is a perspective view illustrating a high-frequency circuit 1 according to a seventh embodiment.

FIG. 14 is a perspective view illustrating the high-frequency circuit 1 according to the seventh embodiment. In FIG. 14, the same reference numerals as in FIG. 2 indicate the same or corresponding parts, and therefore description thereof is omitted.

Figure 15:
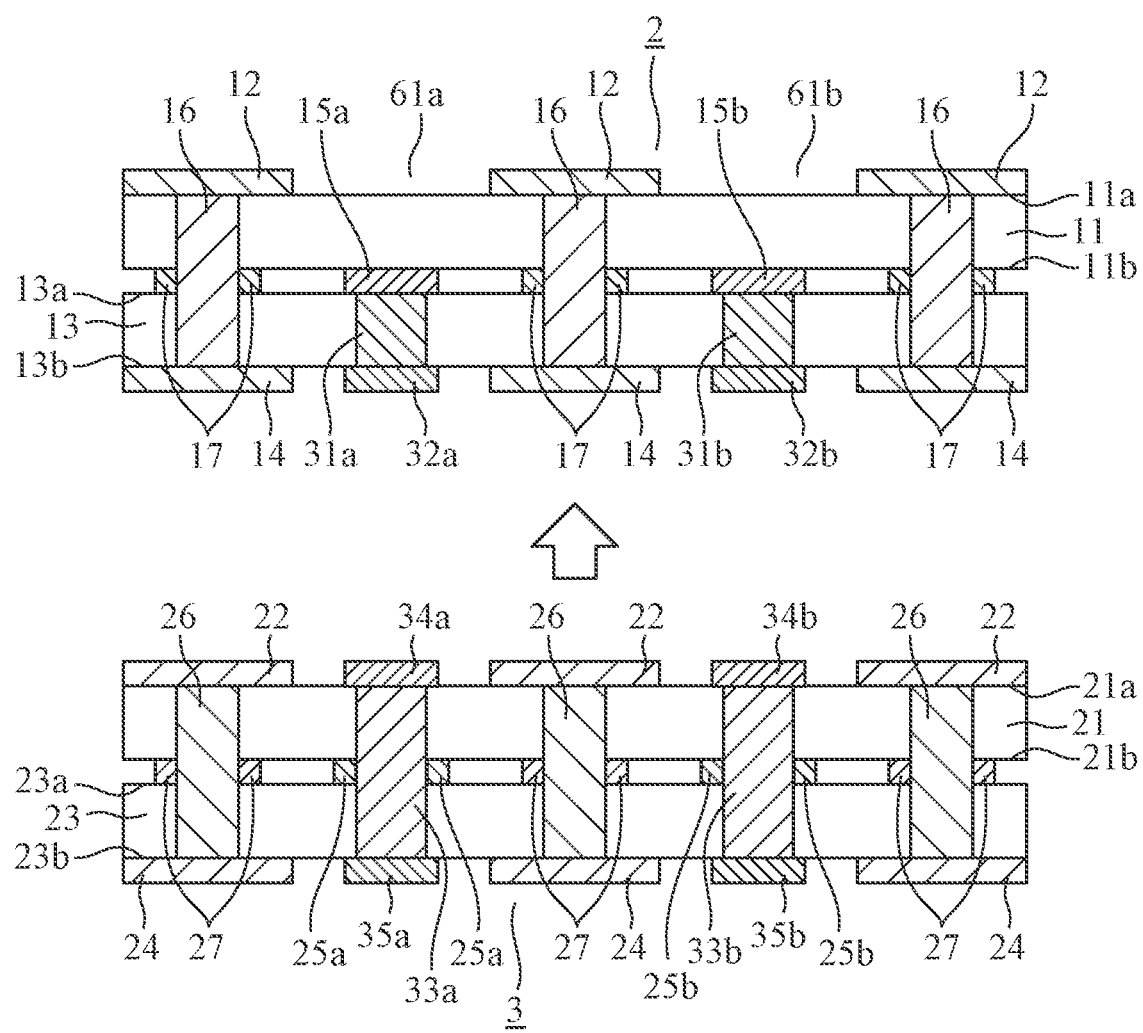
FIG. 15 is a cross-sectional view illustrating a cross section taken along line $C_1$-$C_2$ in a connecting portion 4 before a printed circuit board 2 and a flexible circuit board 3 are connected to each other.

FIG. 15 is a cross-sectional view illustrating a cross section taken along line $C_1$-$C_2$ in a connecting portion 4 before a printed circuit board 2 and a flexible circuit board 3 are connected to each other. In FIG. 15, the same reference numerals as in FIGS. 5 and 7 indicate the same or corresponding parts, and therefore description thereof is omitted.

The opening 61a is a hole formed in the first ground conductor 12.

The position where the opening 61a is formed is a position facing a first signal line 15a in the connecting portion 4.

The opening 61b is a hole formed in the first ground conductor 12.

The position where the opening 61b is formed is a position facing a first signal line 15b in the connecting portion 4.

In the high-frequency circuit 1 illustrated in FIG. 14, the openings 61a and 61b are applied to the printed circuit board 2 in the connecting portion 4 illustrated in FIG. 7. However, this is merely an example, and the openings 61a and 61b may be applied to the printed circuit board 2 in the connecting portion 4 illustrated in FIG. 5.

For example, when a signal is input to the first signal line 15a of the printed circuit board 2, the input signal is transmitted through the first signal line 15a.

The signal transmitted through the first signal line 15a is transmitted to the second signal line 25a of the flexible circuit board 3 via the first connecting conductor 31a and the second connecting conductor 33a.

The signal transmitted to the second signal line 25a is transmitted through the second signal line 25a.

When a signal is input to the first signal line 15b of the printed circuit board 2, the input signal is transmitted through the first signal line 15b.

The signal transmitted through the first signal line 15b is transmitted to the second signal line 25b of the flexible circuit board 3 via the first connecting conductor 31b and the second connecting conductor 33b.

The signal transmitted to the second signal line 25b is transmitted through the second signal line 25b.

For example, when a signal is transmitted through the first signal line 15a of the printed circuit board 2, an electric field is generated from the first signal line 15a also in the connecting portion 4.

For example, when the generated electric field leaks to the outside of the printed circuit board 2 and reaches the first signal line 15b, crosstalk occurs between the first signal line 15a and the first signal line 15b.

However, in the printed circuit board 2 illustrated in FIG. 15, since the first ground conductor 12 is formed on the first surface 11a of the first dielectric layer 11, leakage of the generated electric field from the first surface 11a of the first dielectric layer 11 to the outside of the printed circuit board 2 is reduced.

In addition, in the printed circuit board 2 illustrated in FIG. 15, since the second ground conductor 14 is formed on the fourth surface 13b of the second dielectric layer 13, leakage of the generated electric field from the fourth surface 13b of the second dielectric layer 13 to the outside of the printed circuit board 2 is reduced.

In the printed circuit board 2 illustrated in FIG. 15, the openings 61a, 61b are formed in the first ground conductor 12, and an electric field may leak from the openings 61a and 61b to the outside. However, the generated electric field is concentrated in a region where a conductor is present, and is hardly concentrated in a region where no conductor is present. Therefore, since most of the generated electric field is concentrated in a region where the first ground conductor 12 is formed, there will be only slight electric field leaking outside through the openings 61a and 61b where the conductor is not formed.

An impedance of each of the first signal lines 15a and 15b and the second signal lines 25a and 25b is designed to be, for example, 50Ω.

However, in the connecting portion 4, by supply of solder from the second ends 35a and 35b of the second connecting conductors 33a and 33b constituted by through-hole vias, the printed circuit board 2 and the flexible circuit board 3 are connected to each other.

In addition, the second connecting conductor 33a, the first end 34a of the second connecting conductor 33a, and the second end 35a of the second connecting conductor 33a are arranged in the second signal line 25a, and the second connecting conductor 33b, the first end 34b of the second connecting conductor 33b, and the second end 35b of the second connecting conductor 33b are arranged in the second signal line 25b.

For this reason, since a ground conductor cannot be arranged at a position facing the second signal lines 25a and 25b, the impedance of each of the second signal lines 25a and 25b may deviate from 50Ω. When the impedance of each of the second signal lines 25a and 25b deviates from 50Ω, resonance occurs due to reflection of an electrical signal, and a passing band is limited due to the occurrence of resonance. When the openings 61a and 61b are not formed in the first ground conductor 12, a high-frequency component is coupled to the first ground conductor 12, and a capacitive component tends to increase.

In the printed circuit board 2 illustrated in FIG. 15, since the openings 61a and 61b are formed in the first ground conductor 12, the capacitive component of the printed circuit board 2 in the connecting portion 4 is reduced as compared with that in a printed circuit board 2 in which the openings 61a and 61b are not formed.

Since the capacitive component of the printed circuit board 2 in the connecting portion 4 is reduced, the impedance of each of the first signal lines 15a and 15b and the second signal lines 25a and 25b increases. Therefore, by adjusting the sizes of the openings 61a and 61b in the first ground conductor 12, the impedance of each of the signal lines can be close to 50Ω.

Figure 16:
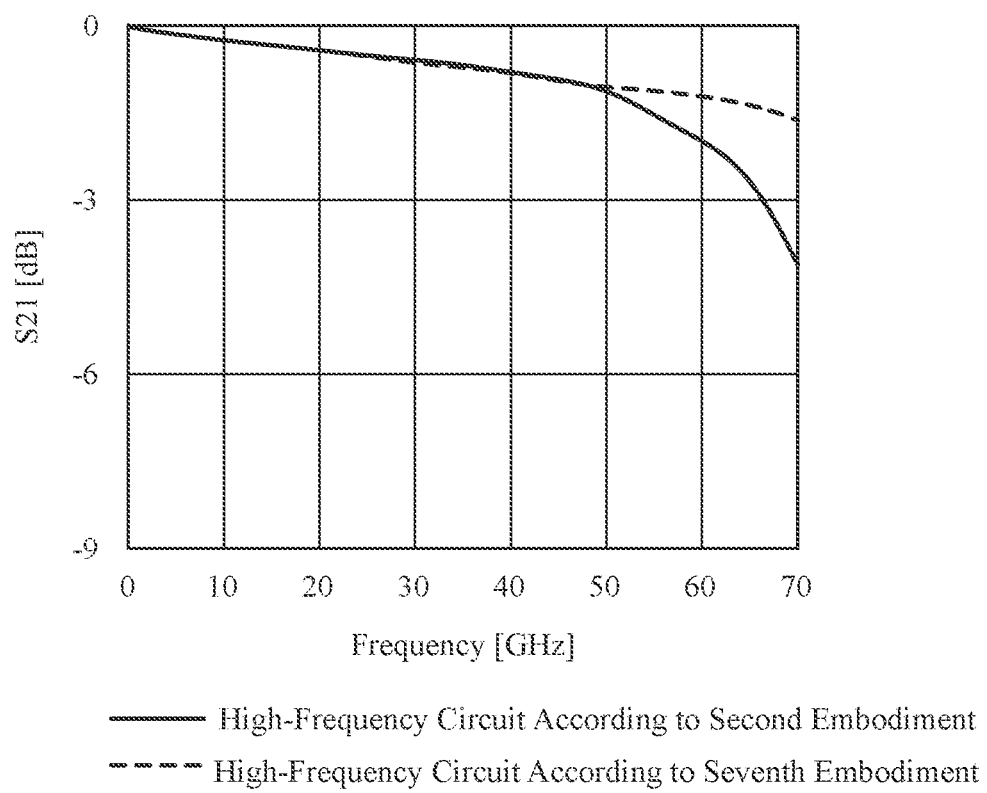
FIG. 16 is an explanatory diagram illustrating a simulation result of a signal passing characteristic in the high-frequency circuit 1.

FIG. 16 is an explanatory diagram illustrating a simulation result of a signal passing characteristic in the high-frequency circuit 1.

In FIG. 16, the horizontal axis represents a frequency [GHz] of a signal transmitted through each of the first signal line 15a and the second signal line 25a, and the vertical axis represents an S parameter (S21) indicating a signal loss.

The solid line indicates a signal passing characteristic in the high-frequency circuit 1 according to the second embodiment, and the broken line indicates a signal passing characteristic in the high-frequency circuit 1 according to the seventh embodiment.

It can be seen from FIG. 16 that the high-frequency circuit 1 according to the seventh embodiment can significantly reduce a signal loss in a band having a frequency equal to or more than 50 GHz as compared with the high-frequency circuit 1 according to the second embodiment.

Figure 17:
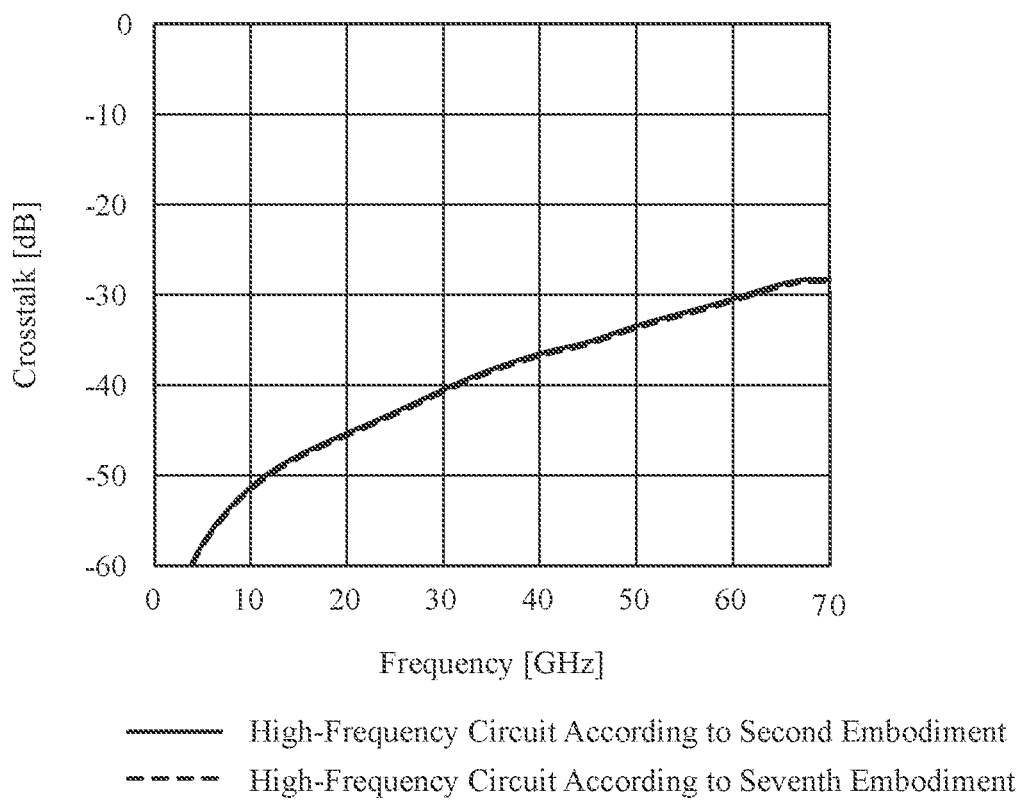
FIG. 17 is an explanatory diagram illustrating a simulation result of crosstalk caused by leakage of an electric field from the connecting portion 4.

FIG. 17 is an explanatory diagram illustrating a simulation result of crosstalk caused by leakage of an electric field from the connecting portion 4.

In FIG. 17, the horizontal axis represents a frequency [GHz] of a signal transmitted through each of the first signal line 15a and the second signal line 25a, and the vertical axis represents crosstalk [dB].

It can be seen from FIG. 17 that the high-frequency circuit 1 according to the seventh embodiment can suppress crosstalk similarly to the high-frequency circuit 1 according to the second embodiment.

In the seventh embodiment described above, the high-frequency circuit 1 is configured in such a manner that the openings 61a and 61b are formed in the first ground conductor 12 at position facing the first signal lines 15a and 15b in the first ground conductor 12 disposed on the first surface 11a in the connecting portion 4 between the printed circuit board 2 and the flexible circuit board 3. Therefore, the high-frequency circuit 1 according to the seventh embodiment can suppress leakage of an electric field from the connecting portion 4 between the printed circuit board 2 and the flexible circuit board 3, and can also reduce a signal loss as compared with the high-frequency circuit 1 according to the second embodiment.

Note that the present disclosure can freely combine the embodiments to each other, modify any constituent element in each of the embodiments, or omit any constituent element in each of the embodiments.

INDUSTRIAL APPLICABILITY

The present disclosure is suitable for a high-frequency circuit including a printed circuit board and a flexible circuit board, and a communication module including a high-frequency circuit.

REFERENCE SIGNS LIST

1: High-frequency circuit, 2: Printed circuit board, 3: Flexible circuit board, 4: Connecting portion, 4a: First connecting portion, 4b: Second connecting portion, 11: First dielectric layer, 11a: First surface, 11b: Second surface, 12: First ground conductor, 13: Second dielectric layer, 13a: Third surface, 13b: Fourth surface, 14: Second ground conductor, 15a, 15b: First signal line, 16: First ground connecting conductor, 17: Conductor, 21: Third dielectric layer, 21a: Fifth surface, 21b: Sixth surface, 22: Third ground conductor, 23: Fourth dielectric layer, 23a: Seventh surface, 23b: Eighth surface, 24: Fourth ground conductor, 25a, 25b: Second signal line, 26: Second ground connecting conductor, 27: Conductor, 31a, 31b: First connecting conductor, 32a, 32b: Second end of first connecting conductor, 33a, 33b: Second connecting conductor, 34a, 34b: First end of second connecting conductor, 35a, 35b: Second end of second connecting conductor, 41a, 41b, 41c, 51a, 51b: Region, 61a, 61b: Opening

The invention claimed is:
1. A high-frequency circuit comprising:
a printed circuit board; and
a flexible circuit board being connected to the printed circuit board,
the printed circuit board includes:
a first dielectric layer having a first surface and a second surface, on the first surface a first ground conductor being formed;
a second dielectric layer having a third surface and a fourth surface, on the fourth surface a second ground conductor being formed; and
a plurality of first signal lines wired between the second surface and the third surface,
the flexible circuit board includes:
a third dielectric layer having a fifth surface and a sixth surface, on the fifth surface a third ground conductor being formed;
a fourth dielectric layer having a seventh surface and an eighth surface, on the eighth surface a fourth ground conductor being formed; and
a plurality of second signal lines wired between the sixth surface and the seventh surface,
wherein a connecting portion that is a portion between the printed circuit board and the flexible circuit board, includes:
a plurality of first connecting conductors each having a first end and a second end, each of the first ends being connected to the corresponding first signal line, each of the second ends being exposed from the fourth surface without conducting the second ground conductor, the plurality of first connecting conductors including a first connecting conductor and a second connecting conductor, the plurality of first signal lines and the plurality of second signal lines extending in a signal transmission direction, a position of the first connecting conductor in the signal transmission direction and a position of the second connecting conductor in the signal transmission direction being different;

a plurality of second connecting conductors each having a first end and a second end, each of the first ends being exposed from the fifth surface without conducting the third ground conductor and being connected to the second end of the corresponding first connecting conductor, each of the second ends being connected to the corresponding second signal line;

a first ground connecting conductor being disposed between the plurality of first signal lines at the position of the first connecting conductor in the signal transmission direction and having a first end and a second end, the first end of the first ground connecting conductor being connected to the first ground conductor, the second end of the first ground connecting conductor being connected to the second ground conductor; and a second ground connecting conductor being disposed between the plurality of first signal lines at the position of the second connecting conductor in the signal transmission direction and having a first end and a second end, the first end of the second ground connecting conductor being connected to the first ground conductor, the second end of the second ground connecting conductor being connected to the second ground conductor.

2. The high-frequency circuit according to claim 1 further comprising:

a third ground connecting conductor being disposed between the plurality of second signal lines and having a first end and a second end, the first end being connected to the third ground conductor, the second end being connected to the fourth ground conductor.

3. The high-frequency circuit according to claim 2, wherein the fifth surface includes at least one region where the third ground conductor is not formed, the region facing one of the second signal lines, and the eighth surface includes at least one other region where the fourth ground conductor is not formed, the other region facing another second signal line adjacent to the one of the second signal lines.

4. A communication module comprising the high-frequency circuit as in claim 3.

5. A communication module comprising the high-frequency circuit as in claim 2.

6. The high-frequency circuit according to claim 1, wherein the fifth surface includes at least one region where the third ground conductor is not formed, the region facing one of the second signal lines.

7. A communication module comprising the high-frequency circuit as in claim 6.

8. The high-frequency circuit according to claim 1, wherein the first surface includes at least one region where the first ground conductor is not formed, the region facing one of the first signal lines.

9. A communication module comprising the high-frequency circuit as in claim 8.

10. The high-frequency circuit according to claim 1, wherein the third dielectric layer has a different thickness from the fourth dielectric layer.

11. A communication module comprising the high-frequency circuit as in claim 10.

12. The high-frequency circuit according to claim 1, wherein the number of the first signal lines is two, and the number of the second signal lines is two, the connecting portion between the printed circuit board and the flexible circuit board includes:

a first connecting portion electrically connecting one first signal line of the two and one second signal line of the two to each other; and a second connecting portion electrically connecting the other first signal line of the two and the other second signal line of the two to each other, and wherein, the first connecting portion and the second connecting portion are disposed in different positions having different signal-transmission-direction-components in the flexible circuit board.

13. A communication module comprising the high-frequency circuit as in claim 12.

14. The high-frequency circuit according to claim 1, wherein in the connecting portion between the printed circuit board and the flexible circuit board, the first ground conductor is formed with at least one opening, the opening facing one of the first signal lines.

15. A communication module comprising the high-frequency circuit as in claim 14.

16. A communication module comprising the high-frequency circuit as in claim 1.

* * * * *